United States Patent [19]

Linker et al.

[11] Patent Number: 4,704,700
[45] Date of Patent: Nov. 3, 1987

[54] APPARATUS AND METHOD FOR LEAD INTEGRITY DETERMINATION FOR DIP DEVICES

[75] Inventors: Frank V. Linker, Broomall, Pa.; Thomas E. Shuren, Stanhope, N.J.

[73] Assignee: American Tech Manufacturing, Inc., Glenolden, Pa.

[21] Appl. No.: 735,857

[22] Filed: May 20, 1985

[51] Int. Cl.$^4$ ............................................ G01R 31/02
[52] U.S. Cl. ...................................... 364/550; 29/741; 324/73 PC
[58] Field of Search ............ 364/550, 561; 324/73 R, 324/73 PC, 158 F, 158 R; 356/237; 29/574, 741, , 835, 836, 838, 593

[56] References Cited

U.S. PATENT DOCUMENTS

| | | | |
|---|---|---|---|
| 4,405,233 | 9/1983 | Grau | 324/73 RX |
| 4,446,481 | 5/1984 | Edamatsu et al. | 356/237 X |
| 4,463,310 | 7/1984 | Whitley | 324/73 PC |
| 4,485,548 | 12/1984 | Janisiewicz | 29/741 |
| 4,553,843 | 11/1985 | Langley et al. | 356/375 |
| 4,557,043 | 12/1985 | Starski | 29/593 X |
| 4,622,740 | 11/1986 | Mirley, Jr. et al. | 29/741 X |

Primary Examiner—Gary V. Harkcom
Assistant Examiner—H. R. Herndon
Attorney, Agent, or Firm—Eugene E. Renz, Jr.

[57] ABSTRACT

An apparatus for determining lead integrity of DIP devices, wherein the leads of the DIP devices extend from a track for supporting the DIP devices during passage through the apparatus. Included is a transmitter for the transmission of a signal, positioned so that the leads of the DIP devices traveling on the track intersect the transmitted signals and a receiver for receiving and converting a transmitted signal to an electrical signal, positioned so that as the leads of the DIP device intersect the transmitted signal, the receiver generates an electrical signal reflective of the intersection for determining the integrity of the leads based upon the electrical signal. The receiver includes receptors positioned on either side of the track such that each receptor receives the transmitted signal intersected by the leads as the DIP devices travel on the track. The receptors are arranged wherein a first receptor is oriented upstream along the track and wherein at least two other receptors are oriented such that one is further than the other from the track in order to receive signals which intersect the leads at at least two spaced points therein. Both other receptors are downstream in the direction of travel of the DIP devices.

19 Claims, 23 Drawing Figures

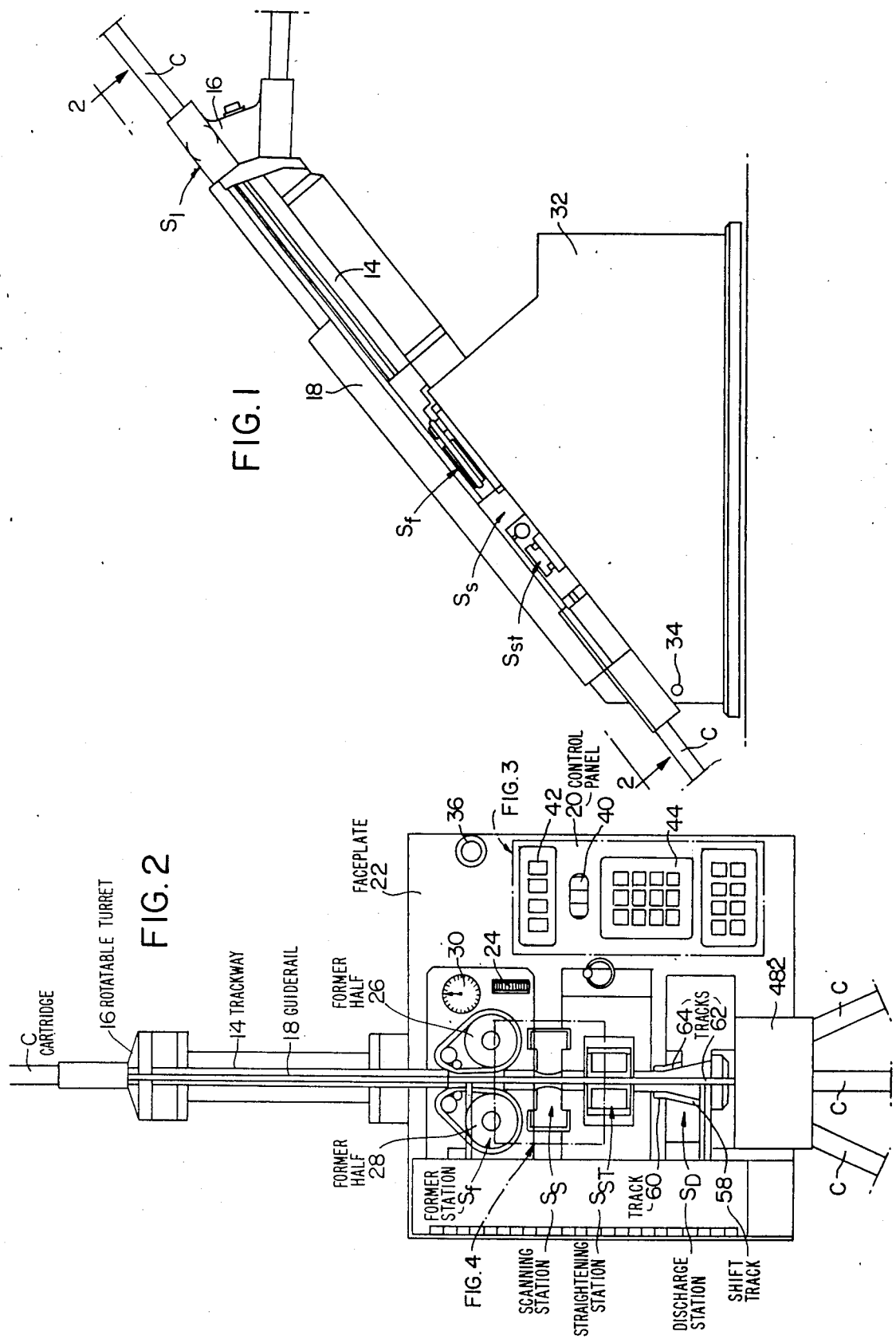

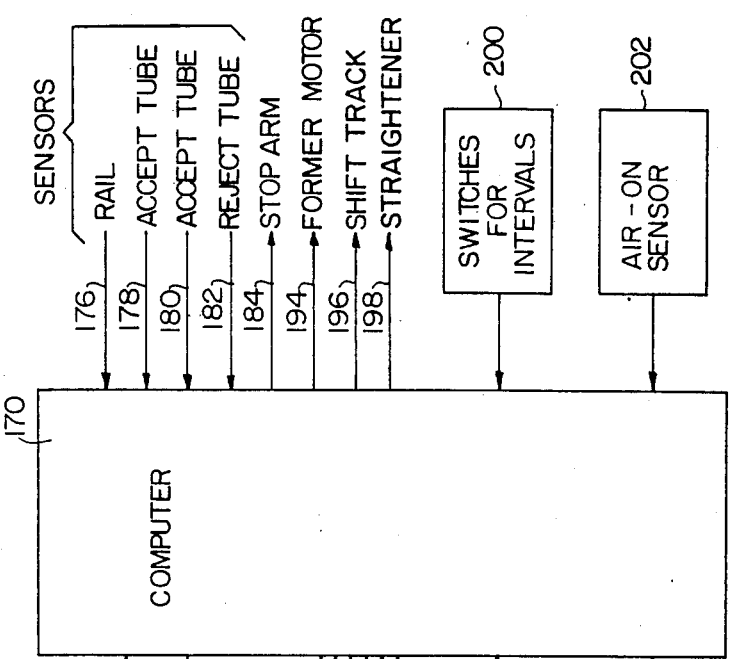
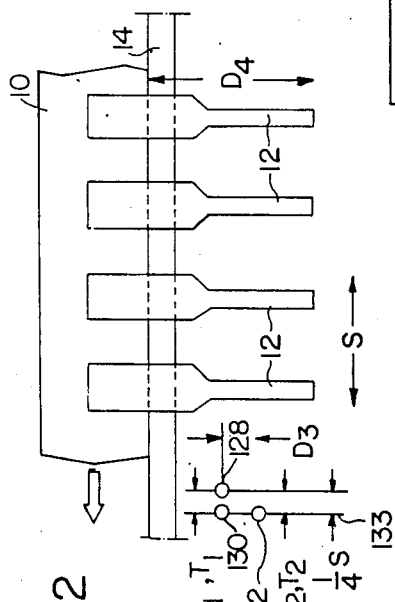
FIG. 12
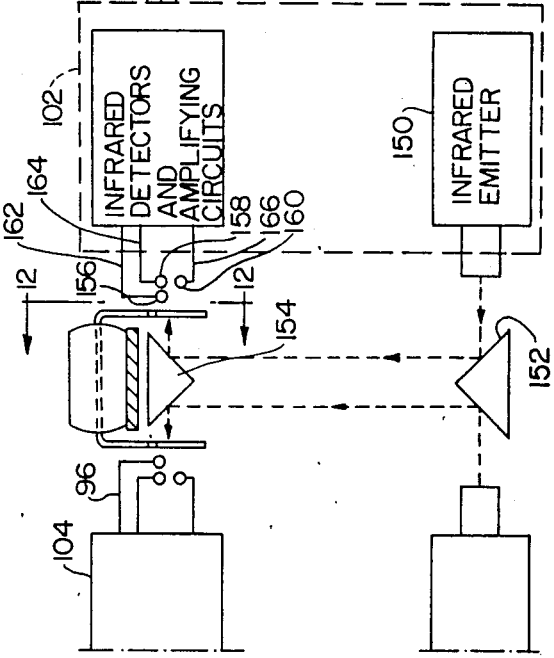
FIG. 11

APPARATUS AND METHOD FOR LEAD INTEGRITY DETERMINATION FOR DIP DEVICES

FIELD OF THE INVENTION

The present invention broadly relates to a new and improved method and apparatus for determining lead integrity of electronic components. More specifically, the invention is directed to a novel method and apparatus for determining lead integrity of so-called dual-in-line package (DIP) devices, typically used for the assembly of integrated circuits on printed circuit boards (PCB), for example LSI and VLSI devices.

DIP devices are typically comprised of an elongated generally rectangular body portion made of moldable material and having embedded therein a plurality of leads arranged in rows depending from opposite side edges of the body portion and disposed at a predetermined angular relation thereto. During manufacture of DIP devices a protective harness, to maintain leads uniformly spaced and in straight parallel relation, is connected to the outer terminal ends of the leads. Prior to PCB assembly, the harness is removed to allow the insertion of the DIP device into a socket containing a plurality of prepatterned openings. Since the leads of DIP devices absent the harness are somewhat fragile and tend to bend during handling and shipment from their predetermined orientation for PCB installation, it is necessary to determine the integrity of the leads prior to their attempted mounting. The leads, for appropriate use in a PCB mounting operation, require lead disposition at not only the preferred predetermined angle in relation to the body but also substantial parallel mutual relationship, one to another and generally predetermined uniform spacing therebetween. Consequently, integrity as used herein includes the determination of whether any of the leads are missing, whether any of the leads have been misaligned with regard to their predetermined angular relationship with the DIP device body, whether the predetermined uniform spacing is present and whether the leads have changed their parallel mutual relationship.

BACKGROUND OF THE INVENTION

As is well known in the art, DIP devices consisting of a body portion, and attached and depending leads connected thereto for assembly into a PCB or the like, are manufactured with the leads disposed in a particular arrangement adapted for insertion in the predetermined array or pattern of holes or sockets in a PCB. The material of the leads and their connection to, and disposition on, the DIP bodies frequently results in a bending or distortion of the leads due to handling during manufacturing operations.

Since bent or distorted leads of DIP devices will prevent their insertion into predetermined arrays or sockets in a PCB, a need exists for apparatus which determine the integrity of DIP leads prior to insertion on a PCB. As a response to this need, lead straighteners were developed, such as that described in U.S. Pat. No. 3,880,205 for ELECTRONIC COMPONENT LEAD STRAIGHTENING DEVICE AND METHOD, and U.S. Pat. No. 4,481,984 for ELECTRONIC COMPONENT LEAD STRAIGHTENING DEVICE AND METHOD both owned by the assignee of the instant application. Without a device for determining lead integrity, proper orientation of DIP leads could only be assured by passing every DIP device through a lead straightening apparatus prior to insertion on a PCB.

Consequently, a device for determining lead integrity prior to the straightening operation was developed. This device is described in U.S. patent application Ser. No. 648,872 for APPARATUS AND METHOD FOR LEAD INTEGRITY DETERMINATION for DIP devices filed Sept. 10, 1984 and incorporated herein by reference. Such a device provided for the inspection of a large number of DIPs per hour since only those DIP leads requiring straightening and only those DIP leads for which a straightening operation would produce an acceptable result were operated upon. DIP devices with straight leads were automatically passed to an "accepted" receptacle. DIPs with leads, so bent that correction would not be achieved by a straightening operation, were passed to a "rejected" receptacle.

In this prior device angular deviation of leads was determined through the use of a formula which included distance values between a triangular array of sensors. Such a system necessitated the physical measurement of the actual distance between sensors, which measurement was thereafter entered into the system through a series of electrical switches. This system proved cumbersome and in light of the scale of distance being measured, i.e. thousandths of inches, very time consuming. Additionally, it was found that certain deformities in DIP leads were not being discovered. Such deformities are of the type shown in FIG. 13 wherein the DIP lead is bent at two locations such that the terminal portion of the DIP lead is in parallel mutual relationship with the other DIP leads. However, as can be seen, the spacing between leads is no longer uniform. The bent lead is closer to the one adjacent lead than another lead. The attempted insertion of such a device can only result in failure.

Also in this prior integrity device, DIP leads were made to pass through light transmitted by a series of mirror-like components. Since each of these components was physically mounted with adhesive or the like in a housing, angular deviations would result as well as occasionally impairing the reflective quality of the component by the accidental deposit of adhesive on the reflecting surface.

SUMMARY OF THE INVENTION

The present invention provides an improved method and apparatus for determining lead integrity of DIP devices which is characterized by novel features of construction and arrangement which eliminates some of the problems of prior devices discussed above. A principal feature of the present invention results in the improved accuracy of a scanner assembly which essentially comprises a pair of scanner heads disposed on either side of a trackway for the travel of DIP devices thereon wherein the leads of the DIP devices extend downwardly on either side of the trackway generally perpendicular thereto. Each scanner head has a groove formed at one end, which groove is positioned beneath the outer edges of the trackway, such that as DIP devices travel the length of the track, the leads of the DIP devices will pass through the grooves in the scanner heads. The grooves in the scanner head are generally parallel to the center line of the track. Light is transmitted across a portion of the groove to an arrangement of sensors which convert the light signal to an electrical signal. Integrity is determined by analyzing the occlusion of the sensors from the light by DIP leads.

The scanner assembly in a preferred arrangement is combined in an apparatus having a number of stations for various operations of DIP devices. Each of such stations may include pneumatic, electronic or mechanical sub-assemblies. Such apparatus broadly includes an elongated fixed trackway having a loading station at one end. The loading station aligns a cartridge containing a number of DIP devices with the trackway for passage of DIP devices from cartridge to trackway. DIP devices passing onto the trackway travel to a former station where DIP leads are passed over an anvil having tapered surfaces to assure that DIP leads are not bent excessively inwardly or outwardly from the center of the DIP. A more complete description of the former apparatus can be obtained from U.S. application Ser. No. 648,872 identified above or from U.S. application Ser. No. 710,032 now U.S. Pat. No. 4,665,954-Linker at al for HIGH SPEED LEAD CONFORMATION INTEGRITY TESTING AND STRAIGHTENING APPARATUS AND METHOD filed Mar. 11. 1985, also incorporated herein by reference. DIP devices pass from the former station through the scanner assembly where any further deviations of the leads are determined. Such a determination is accomplished for example by a computer analysis of the signals from the scanner heads. If it is determined that the leads require straightening, the DIP passes to a straightening station where it is stopped momentarily for a straightening operation to occur before passing to a discharge station for placement in a cartridge designated for acceptable DIP devices. If it is determined at the scanning station that a straightening operation would still not ensure lead integrity, i.e. if leads are missing, the DIP device will pass directly through the straightening station to the discharge station for placement in a cartridge designated for rejected DIP devices.

Additionally, the scanner head design provides a novel size adjustment arrangement for various width DIP devices. Each scanner head contains a transmitting means and receiving means. The transmitting means is for the transmission of a signal such as light across the groove in the scanner head so that the leads of DIP devices traveling on the trackway will intersect the light signal when passing through the groove. Receiving means such as photo sensors are positioned on a side of the groove opposite the transmitting means to receive the intersected light signal and are capable of converting the light signal to an electrical signal. Since these components are self-contained in each head, it becomes necessary only to position the groove relative to the center line of the trackway for various width DIP devices. Thus it can be seen that DIP leads traveling through the groove will occlude the sensors from the light transmitted therein.

A principal feature of the present invention resides in a calibration device used in combination with the scanner heads and a computer wherein use of the calibration device enables the computer to determine the distances between each sensor in each head. In the prior device described in Ser. No. 648,872, DIP lead integrity or deviation was determined through the use of a formula, which formula was dependent upon various distances existing between the sensors. The distance between sensors was physically measured for each scanner head and input as a fixed value to a computer by means of a series of electronic switches. Through the instant invention, the exacting and time consuming technique of physically measuring the distance between sensors has been eliminated. Additionally, the computed distance and thus the ultimate DIP lead deviation determination is more accurate.

The present invention accomplishes more accurate DIP lead deviation determinations by combining with a trackway, light transmitting means and light receiving means of the type described herein, a computer connected to receive electrical signals from the light receiving means, for determining lead integrity, which determination is partially based on distances between sensors in the receiving means, and for determining the distances between sensors based on electrical signals received from the light receiving means when a DIP-like device having known lead characteristics passes the receiving means, and a calibration device which is generally DIP-like in form and having known lead characteristics.

With the foregoing in mind, it is broadly an object of the present invention to provide a new and improved method and apparatus for automatically determining the integrity of leads of electronic components, particularly DIP devices of the type described above.

Another object of the present invention is to provide a method and apparatus for determining lead integrity of DIP devices which incorporates a fixed trackway and wherein as DIP devices travel on said trackway, the integrity of the leads may be easily and quickly determined.

Another object of the present invention is to provide a method and apparatus for determining lead integrity of DIP devices which incorporates a transmission member for transmitting a signal in relation to a fixed trackway so that leads of DIP devices traveling on the trackway intersect the transmitted signal and arranging a receiving device for receiving the intersected transmission and for converting the received transmission to an electrical signal reflective of the intersection by the leads.

Another object of the present invention is to provide a method and apparatus for determining the lead integrity of DIP device which includes a computer device for determining the integrity of the leads based upon electrical signals received from scanner devices positioned on either side of a trackway on which the DIP devices travel, which determination is based in part upon the distances between sensors in the scanner devices, and which computer device determines the distance between sensors based on the electrical signals received from the scanner device when a DIP-like device having known lead characteristics passes the scanner devices.

Another object of the present invention is to provide a calibration device for use with a lead integrity determination apparatus wherein the distance between sensors in such apparatus can be determined through the use of a computer.

DESCRIPTION OF THE DRAWINGS

These and other objects of the present invention and the various features and details of the operation and construction thereof are hereinafter more fully set forth with reference to the accompanying drawings, wherein:

FIG. 1 is a side view of an apparatus for determining the integrity of DIP devices;

FIG. 2 is a sectional view along line 2—2 of FIG. 1;

FIG. 11 is a block diagram of the electronic control components of the instant invention;

FIG. 12 is a diagrammatic view of the leads of a DIP device in relation to the triangular arrangement of fiber optics;

DESCRIPTION OF THE PREFERRED EMBODIMENTS

Figure 13:
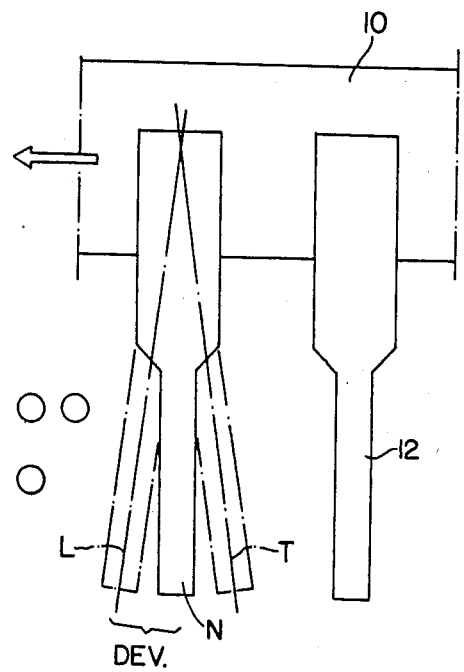
FIG. 13 is an enlarged diagrammatic view showing the angular deviation of DIP leads which is determined by the scanner assembly.

The system and apparatus of the present invention are adapted for determining the lead integrity of DIP devices. Before describing the preferred embodiments of the apparatus, reference is initially made to a description of a DIP device, such as that shown perspectively in FIG. 6, with various lead orientations, as shown in FIG. 13. Generally, DIP devices house integrated circuit technology and comprise an elongated generally rectangular body portion 10 made of a moldable material such as ceramic or plastic, and having embedded therein a plurality of leads or pins 12, which normally are uniformly parallel spaced and in straight rows generally perpendicular to the body portion 10. As shown in FIG. 13, if leads 12, particularly the lead tips, have either a leading (L) angular orientation or a trailing (T) angular orientation relative to the direction of travel, they will be unsuitable for mounting onto a printed circuit board (PCB) containing a predetermined pattern of holes or sockets. It has also been found that during handling and shipment DIP leads will bend in more than one location along their length. This multiple bend condition can result in DIP leads having a terminal portion 13 which is in mutual parallel relationship with adjacent leads but which has nonetheless deviated from a predetermined uniform spacing between leads. As will be appreciated, attempted mounting of a DIP device having leads with the above described deviations would result in gross deformation of the leads when lead tips come into contact with the PCB during the mounting operation and in all likelihood unacceptable contact with the circuit printed on the PCB. A DIP device having leads with such leading, trailing or non-uniform spacing orientations will require a straightening operation prior to their insertion or mounting onto PCBs.

The method of the invention will be presented hereinafter in conjunction with the description of apparatus for determining lead integrity of DIP devices. A general understanding of the basic structure and operation of the apparatus may be gained by several of the views which best show the basic components of the apparatus in operation thereof such as FIGS. 1-3. Considering first the basic components of the integrity apparatus in terms of interrelated functions, the apparatus as best illustrated in FIG. 1 includes an elongated fixed trackway 14 having a loading station $S_L$ at its upper end, a former station $S_F$ downstream in the direction of travel of DIP devices on trackway 14, a scanning station $S_S$, a straightening station $S_{ST}$ and a discharge station $S_D$ at its lower end. A cartridge C for DIP devices housed therein in abutting end-to-end relation is adapted to be positioned at the loading station $S_L$ so that the DIP devices are gravity fed down the trackway 14 through the various stations described above. These DIP devices are presented to loading station $S_L$ by positioning an open end of cartridge C into a rotatable turret-like mechanism 16. Mechanism 16 is turned to align the open end of cartridge C with track 14 so that DIP devices flow freely from the cartridge or tube onto track 14 to former station $S_F$. Position control means in the form of elastomeric belts and a detent mechanism are provided in the former station $S_F$ and the straightening station $S_{ST}$, respectively, which operate in response to an internal computer for controlling the movement of DIP devices through the apparatus. The control system as described in more detail hereafter, also includes means for sensing various positions of DIP devices on trackway 14 to control operation of the elastomeric belt and detent mechanism to effect automatic continuous cycling of the scanner apparatus facilitating high speed processing of DIP devices.

Tracing now briefly a typical cycle of operation, DIP devices initially encounter the former station $S_F$ wherein the elastomeric belts function to release DIP devices one at a time to the scanning station $S_S$ so that only a single DIP device may pass through the scanning station $S_S$ and to the straightening station $S_{ST}$ when the straightening station is conditioned or clear to receive a device for straightening. DIP devices are able to pass freely through the scanning station due to the high speed determination of lead integrity by an internal computer. If the computer, based on the signals received from the scanning station, determines that DIP leads require straightening, DIP devices entering the straightening station are detained by a stop mechanism. A straightening operation thereafter ensues. The details of such straightening operation will not be described in depth herein, as they are described in greater detail in Linker et al U.S. Pat. Nos. 3,880,205 and 4,481,984 previously identified, each of which is incorporated herein by reference. Following the straightening operation, the stop mechanism is raised allowing the DIP device to pass to the discharge station where the DIP in turn is placed on a cartridge designated for acceptable DIP devices. As the DIP device passes through the scanning station, if the computer determines that leads are missing from the DIP device, or that the DIP leads are so distorted that the straightener would not be able to properly reorient the leads, the DIP device is allowed to pass through the straightening station SST directly to the discharge station whereupon it is placed into a cartridge designated for rejected DIP devices.

Referring now to the specific structure of the apparatus, FIG. 1 shows the apparatus as including an elongated guide rail 18 which is coextensive with the trackway 14 and spaced above same so that DIP devices are captive between the track and guide rail during their movement through the apparatus. The space between the guide rail and the trackway is adjustable for DIP devices of different sizes. The guide rails is further mounted for pivoting movement on face plate 22 of the apparatus to a retracted position exposing the track for complete access to the trackway in the event of DIP jamming or the like.

Suitable controls, including circuitry, to be described in more detail hereinafter, are provided for effecting operation of the lead integrity apparatus in the manner broadly described above. A control panel 20 is mounted on face plate 22 within easy view of the operator and includes the various automatic controls for the electronic and pneumatic control systems, i.e. sub-assemblies. A manual control 24 is also provided for moving former halves 26 and 28 towards and away from trackway 14 by any known mechanical means. The former halves serve to force DIP leads over the tapered surface of an anvil to assure the outward angular orientation of the leads. An indicator 30 is provided such that separation of former halves 26 and 28 will be indicated. Thus, the former halves can be separated a prescribed distance to account for various width DIP devices. Face plate 22 is mounted to base 32 by pivot 34. Face plate 22 can be opened outwardly from base 32 by the pressing of latch button 36. The outward opening of base plate 22 serves for ease and maintenance of those components disposed beneath the face plate in the scanner apparatus.

Figure 3:
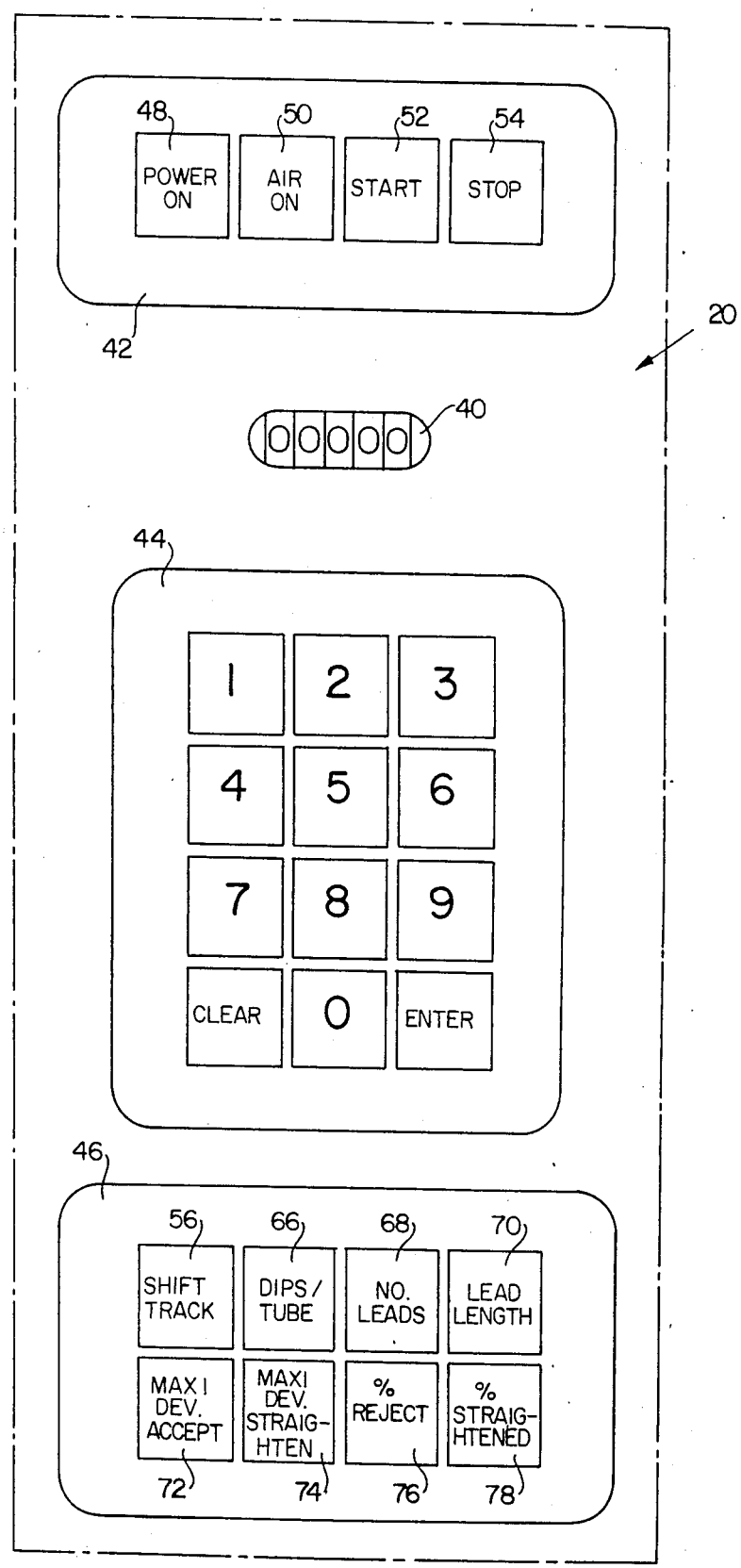
FIG. 3 is a partial enlarged view of the control panel of FIG. 2.

FIG. 3 more particularly discloses the automatic controls contained on control panel 20. Generally, control panel 20 includes a numeric display 40 and three pads of switches, namely, control pad 42, numeric pad 44 and data pad 46. Control pad 42 includes a power-on indicator 48 for indicating that power is being supplied to the apparatus by a power-on switch located elsewhere on the apparatus and not shown in the drawings, and an air-on switch 50 for supplying air to the various pneumatic components of the apparatus. Start and stop switches 52 and 54, respectively, are provided for initiating and interrupting the cycle of operation of the overall apparatus.

Figure 19:
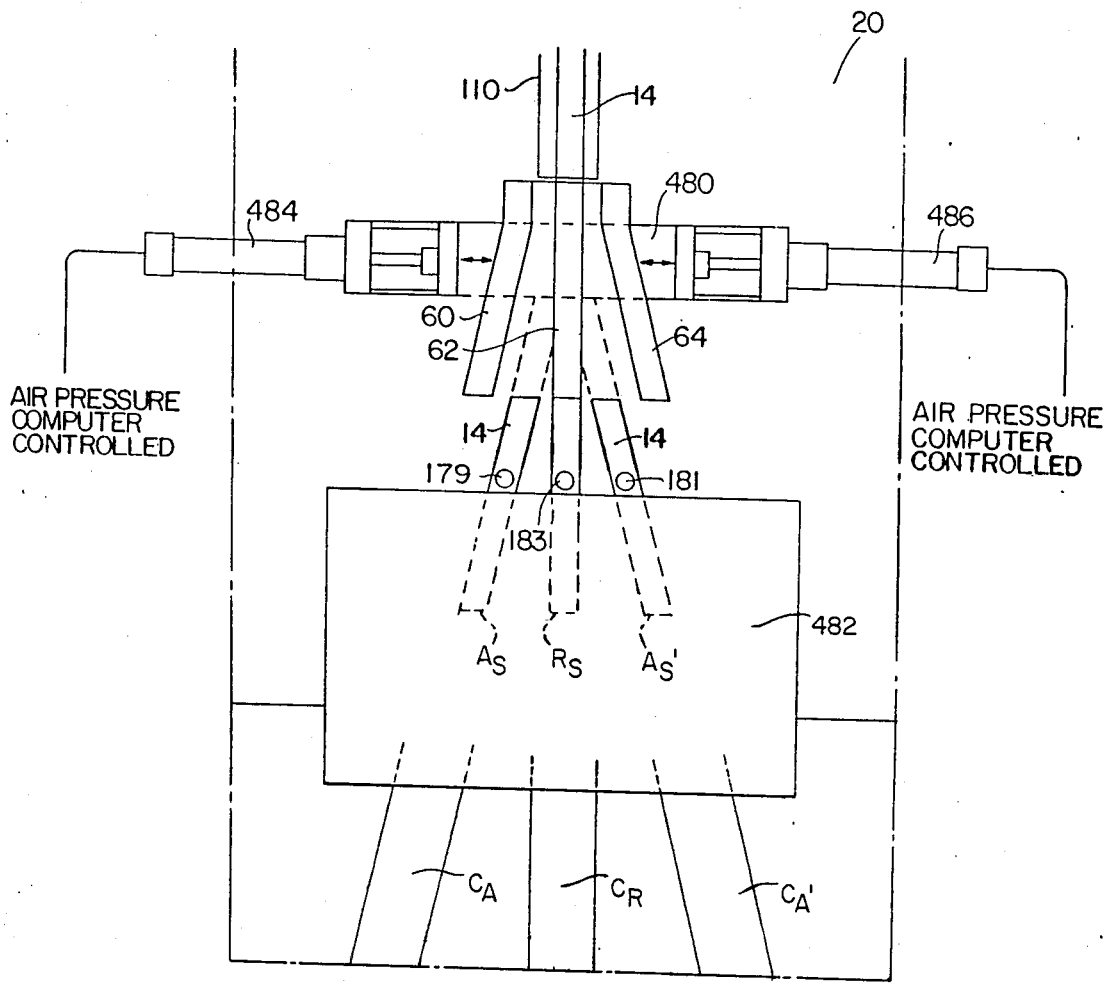
FIG. 19 is a fragmentary, schematic plan view of the three positionable shift track mechanism, partially shown at the bottom of FIG. 2.

Function pad 46 is provided with eight function switches. By way of a switch, not shown in the drawing, the eight function switches each serve first and second functions. In other words pad 46 has the capacity for 16 functions. Shift track switch 56 is operative in the first function mode to move shift track 58 in the discharge station $S_D$ to any one of three alignment positions, two positions for aligning accept tubes with trackway 14 and one aligment position for positioning a reject tube at the end of the trackway. As shown in FIG. 19, discharge station $S_D$ includes a transversely movable shift track 58 which aligns any one of three trackway sections 60, 62 and 64 with trackway 14. DIP devices passing from trackway 14 onto any one of the shift track sections will be directed to the particular cartridge C associated with that shift track portion. In the preferred embodiment, the shift track is actuated pneumatically by a series of air-actuated cylinders.

Data entry switch 66 is provided in the first mode for entering the number of DIP devices which will be placed into each cartridge C contained in the discharge station $S_D$. As will be described in more detail hereinafter, a sensor located in the discharge station provides a signal to the internal computer each time a DIP device passes into a particular tube. The computer counts the number of DIPs which are placed in each tube. If the count equals the amount entered after pushing switch 66, the computer stops the automatic cycling of the integrity apparatus until the full cartridge has been removed and an empty cartridge inserted in its place.

Switch 68 in the first function mode is pressed prior to entering data into the computer as to the number of leads per DIP device which will be scanned. As the DIP device passes through the scanner heads, if the number of leads counted does not equal the number of leads entered with switch 68, the DIP device will be automatically rejected as having missing leads.

Switch 70 in the first function mode is used to enter data into the computer concerning the length of the leads on the DIP devices. This lead length plays a part in the calculation used in the preferred embodiment for determining the angular lead tip deviation of the DIP device.

Switch 72 is used in the first function mode to enter the maximum acceptable deviation, in other words, the amount by which lead tips may deviate from their orientation perpendicular to body 10 before they will require straightening. DIP devices having leads which all fall below this maximum acceptable deviation, will pass directly to one of the cartridges designated for acceptable DIP devices and will not be stopped in the straightening station. Deviation of a lead tip from its normal perpendicular orientation is illustrated in FIG. 13. Along these same lines, switch 74 is provided in the first function mode for entering data into the computer with regard to the maximum deviation for straightening. In other words, if the DIP lead is leading or trailing its normal perpendicular position by an amount which exceeds the deviation entered with switch 74, the straightening device cannot perform a successful operation on the leads. Consequently, such a DIP is placed directly to the cartridge designated for rejected devices.

Switch 76 in the first function mode is not for the purpose of entering data, but rather, depressing switch 76 will list on display 40 the cumulative percent of DIP devices passing through the scanning heads which have been rejected. Likewise, depressing switch 78 in the first function mode will list on display 40 the cumulative percent of DIP devices which passed through the scanner heads and were subsequently straightened by the straightening heads.

Figure 10:
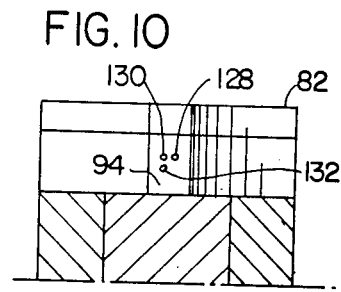
FIG. 10 is a sectional view along the line 10—10 of FIG. 7.

In the second function mode switches 66, 68, 70, 74, 76, and 78 are used to enter calibration data on right scanning head 80 and left scanning head 82. As shown in FIG. 10, each scanning head includes an array of light sensors arranged in a right triangular pattern. As shown in FIG. 13, each array of light sensors comprises an A sensor located at the intersection of the base and hypotenuse of the triangular pattern, a B sensor located at the intersection of the base and side of the triangular pattern downstream in the direction of travel on the trackway, and a C sensor located at the intersection of the hypotenuse and side of the triangular pattern. As can be appreciated from FIGS. 12 and 13 the base of the triangular pattern is generally parallel to the trackway and the C sensor is located further from the trackway than the base. As will be explained in greater detail herein the distances AB, AC and BC are utilized in the determination by the computer of lead integrity. During the calibration mode such distances are determined by the computer, however, it may stil be desirable to enter such distance data manually or to view the distances determined by the computer. Accordingly in the second function mode, switches 66, 68, and 70 serve to enter data for distances AB, AC and BC respectively on left scanning head 82 and switches 74, 76, and 78 for distances AB, AC and BC respectively on right scanning head 80 or upon activation, display the respective distances determined by the computer on numeric diaplay 40. Hereinafter, right and left head distances will be referred to as RAB, RAC, RBC and LAB, LAC and LBC respectively. Further, it will be noted that distance AC is not the length of the hypotenuse, but rather, is the distance between the C sensor and an axis which passes through the A sensor, which axis is also perpendicular to the base of the triangular pattern as shown in FIG. 12.

Figure 4:
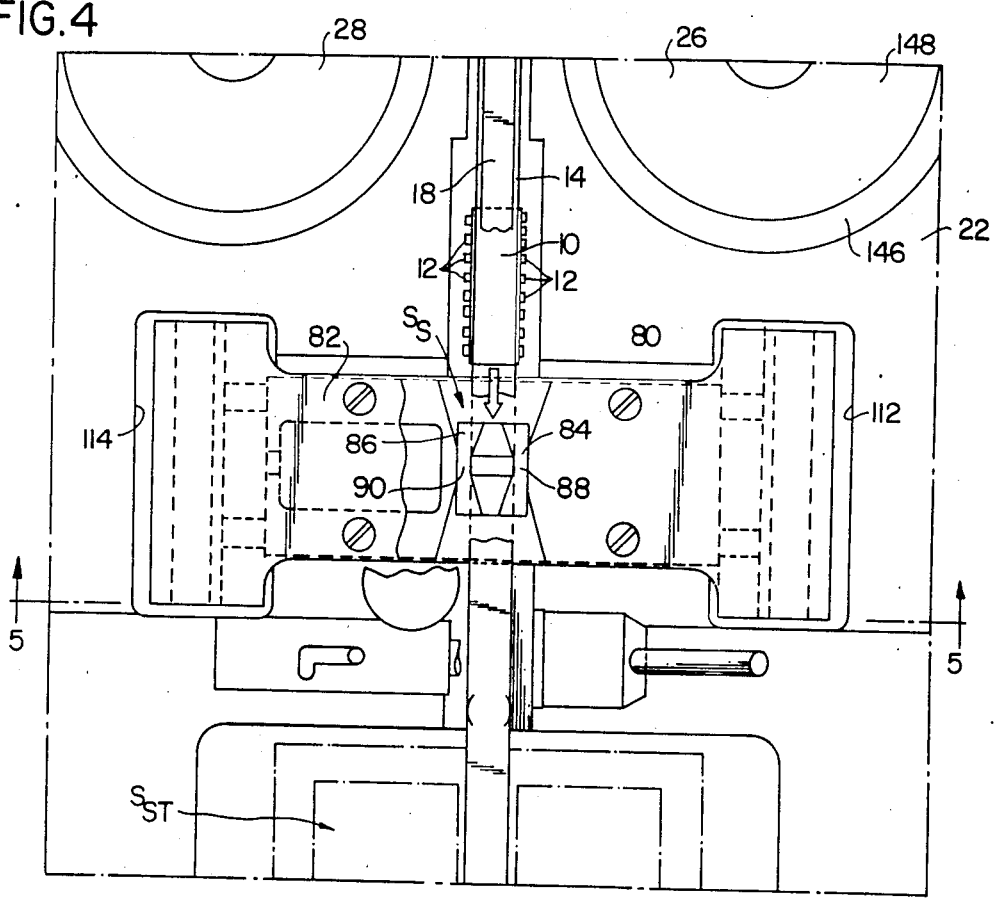
FIG. 4 is a partial enlarged view of the scanning station shown in FIG. 2.

Consider now more specifically the structure of the scanner heads. FIG. 4 shows the relationship and positioning of scanner heads 80 and 82. Each scanning head is shown to contain a groove 84 and 86, respectively, which is oriented generally parallel to the trackway 14. To promote the smooth passage of leads through grooves 84 and 86, the input ends are provided with converging tapered walls and the output ends are provided with diverging tapered walls. At the apex of the groove, points 88 and 90 respectively, scanning of the leads takes place. In the preferred embodiment, scanning is accomplished by the transmission of an infrared light signal across apex 88 and 90 to a set of sensors or receptors located in the side wall 92 and 94, shown in FIG. 6. As the leads of DIP device 10 intersect the infrared light transmission, the set of sensors will pick up such intersection at varying time intervals due to the occlusion of the sensors by DIP leads from the infrared light. In the preferred embodiment, the sensors comprise a series of fiber optic tubes 96, 98, and 100 (only shown for scanner head 82, but also contained in scanner head 80) which transmit the light from apex 88 and 90 to a series of phototransducers which convert the light signal to an electrical signal. In the preferred embodiment, such a phototransducer is the CLR 5101-2 sold by Clairex Electronics of Mount Vernon, N.Y. The phototransducers and the electric circuitry used to amplify and refine the electrical signal are integrally contained within each scanner head in containers 102 and 104, respectively.

Figure 5:
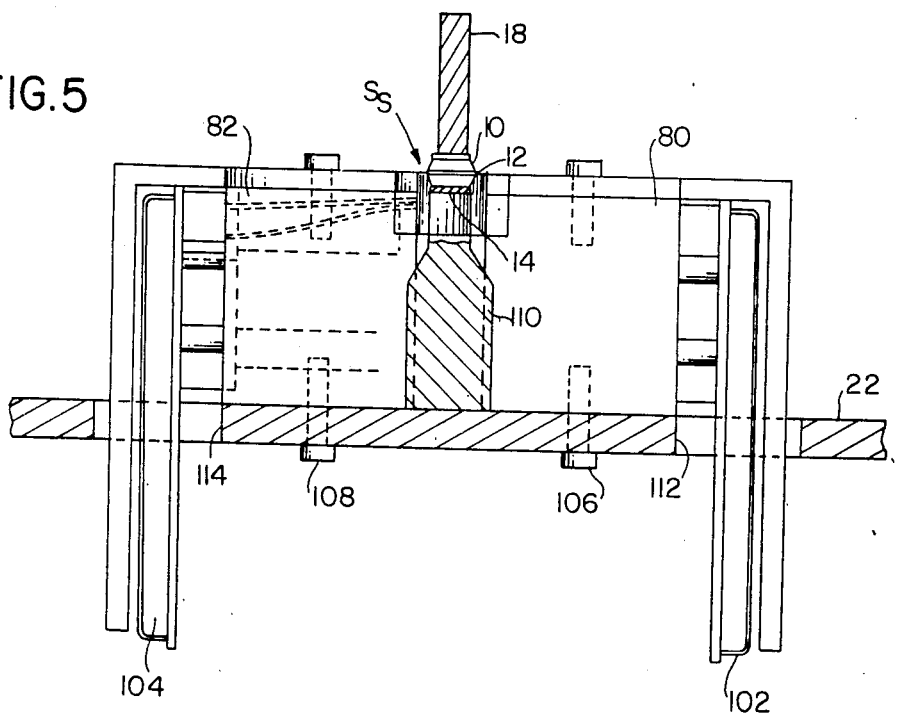
FIG. 5 is a sectional view along line 5—5 of FIG. 2.

As shown in FIG. 5, scanner heads 80 and 82 are securely attached to face plate 22 by bolts 106 and 108. Also attached to face plate 22 is support 110 on which trackway 14 is securely mounted. Openings 112 and 114 are provided so that scanner heads 80 and 82 may be adjusted towards and away from trackway 14 for DIP devices of varying widths. Such transverse adjustments can be made by loosening bolts 106 and 108.

Figure 7:
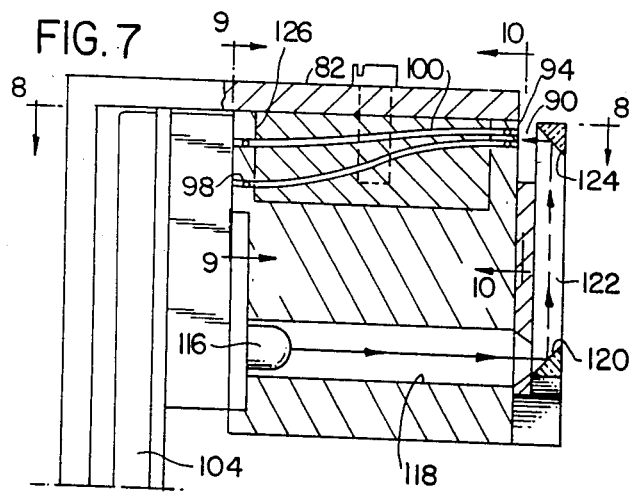
FIG. 7 is a sectional view along the line 7—7 of FIG. 6.

As shown in FIG. 7, an infrared light source 116 transmits light through bore 118 to reflective surface 120 of trapezoidal-shaped, light-conductive component 122. Surface 120 is angularly oriented at approximately 45° to reflect the infrared light upwardly through trapezoidal component 122 to reflective surface 124. Surface 124 is angularly oriented again at approximately 45° to further reflect the infrared light across apex 90 to the fiber optic tubes. It has been found that if light source 116 is placed, for example, at the location of surface 124, so that it transmits directly across apex 90, rather than being recessed to reflect off surfaces 120, 124, a problem with fanning of the light will occur. By fanning we mean that as a DIP lead passes light source 116, portions of the shadow created by the lead will appear at, for example, orifices 130, 132, which are downstream in the direction of travel. Since the DIP lead has not yet traveled to those points, incorrect lead tip deviation will be determined. In alleviating this problem, we have discovered that recessing light source 116 in bores 118, 122, preferably 1⅞ to 2 inches, in the scanning head causes the DIP lead shadow to substantially only appear at the orifice corresponding to the travel of the lead at that point. Such recess distance is calculated by measuring the distance from light source 116 to side wall 94.

Trapezoidal-shaped, light-conductive component 122 in the preferred embodiment is formed of a transparent material such as glass or plastic having mirrored surfaces 120 and 124 painted or otherwise affixed to its sides. Component 122 is thereafter cemented or otherwise secured in the position shown in FIG. 7. Thus, the angular orientation of the reflective surfaces is assured on a component which is relatively simple to mount in the scanning head.

Figure 9:
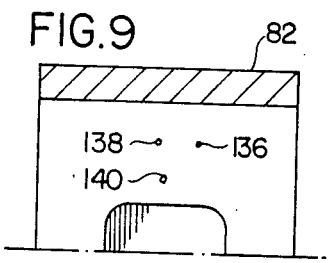
FIG. 9 is a sectional view along the line 9—9 of FIG. 7.

The housing in which these various elements are contained is preferably made of an opaque plastic material. Chamber 126 is preferred so that in the manufacturing process orifices 128, 130 and 132, shown in FIG. 10, can be precision drilled with regard to the distances therebetween. The importance of the distances between these orifices will be discussed in greater detail hereinafter. Further, in the preferred embodiment, after insertion of the fiber optic tubes, chamber 126 is filled with an opaque epoxy resin which serves to isolate and support the fiber-optic tubes 96, 98 and 100. Orifices 136, 138 and 140 are illustrated in FIG. 9 for the purpose of showing that the ends of the fiber optic tubes have been separated. This separation enhances not only their mounting to the photo transducers, but serves to further isolate the light transmitted within each fiber optic tube from being influenced by light contained in any one of the other tubes.

Figure 6:
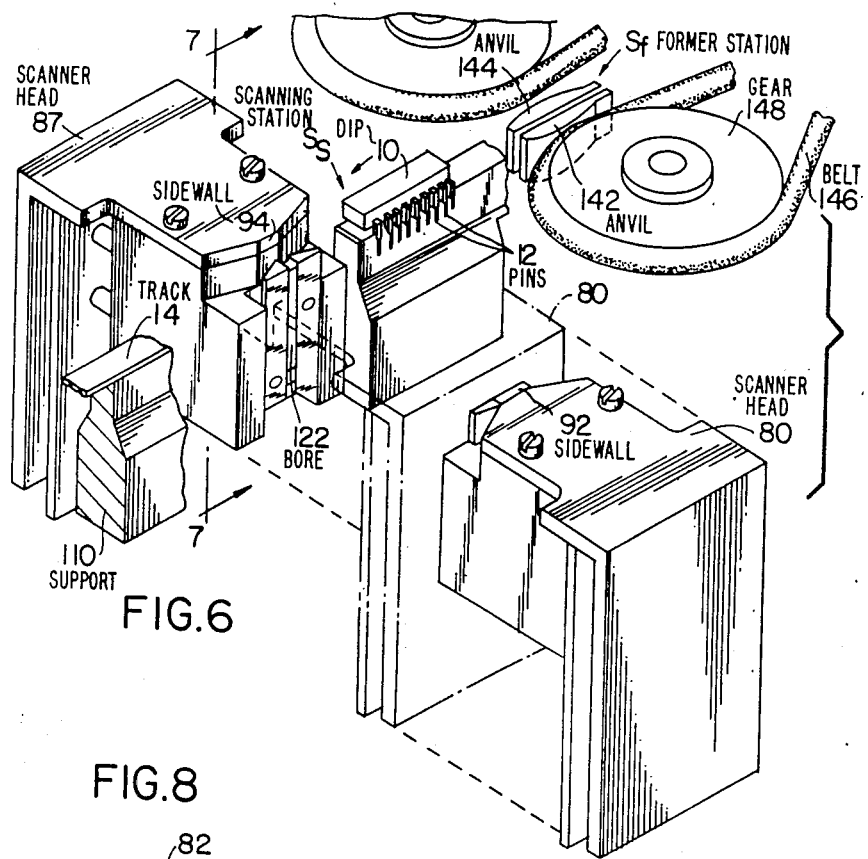
FIG. 6 is a partial perspective view of the scanner head and former assembly of the enlarged view of FIG. 4.
Figure 8:
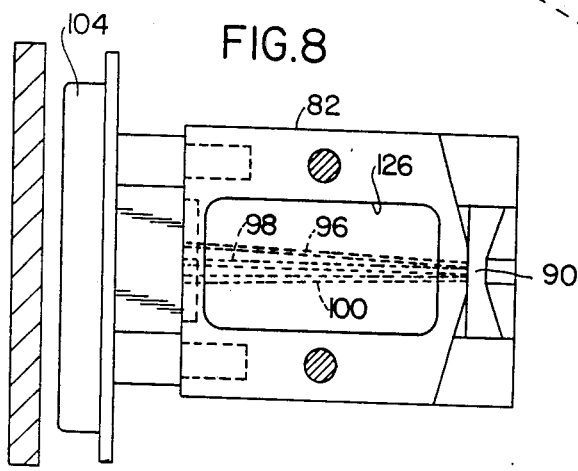
FIG. 8 is a sectional view along the line 8—8 of FIG. 7.

FIG. 6 also disclosed the major components of former station $S_F$. As is shown therein, two anvil halves 142 and 144 are disposed beneath the trackway 14 for engagement with leads of DIP devices. Elastomeric belt 146 is driven by gear 148 which is operatively connected to a drive motor (not shown in the drawing). Elastomeric belt 146 forces the leads of a DIP device traveling through the former station against the tapered surfaces of the anvil. The anvil surfaces force the leads to bend outwardly from the center line of trackway 14. Since the DIP leads are pressed against the anvil halves by elastomeric belt 146, stopping the drive motor will serve to halt the flow of DIP devices through the former station. Thus, the flow of DIP devices from the loading station $S_L$ can be singularized or separated by a predetermined delay interval. While one embodiment of the former station has been shown, other embodiments of this station, which may be referred to, are shown and described in U.S. application Ser. No. 710,032, previously incorporated by reference herein.

Reference is now made to FIG. 11 wherein the internal computer will be described in greater detail. In connection with this figure only the relationship between component 102 of scanner head 80 will be discussed, however, it is to be assumed that similar connections are made for component 104 of scanner head 82. Similar to scanner head 82, scanner head 80 contains an infrared emitter 150 which directs light to the reflective surfaces of trapezoidal component 152. The surfaces of component 152 are angularly oriented to direct light across apex 88 to orifices 156, 158 and 160. Positioned in those orifices are fiber optic tubes 162, 164 and 166 respectively. The fiber optic tubes direct light into appropriate infrared detectors, whereupon the light is converted to an electrical signal. The electrical signal is amplified and transmitted via conductive leads 168 to internal computer 170.

Computer 170 is of a design known in the art and includes in the preferred embodiment an 8031 microprocessor manufactured by Intel Corporation. Through the use of large scale integration (LSI) peripheral devices, the keyboard and display shown in FIG. 3 can be interfaced with the microprocessor in a manner known in the art. Memory 172 is connected to computer 170 and serves to store the software programming to be described in more detail hereinafter. Power is provided to computer 170 by an appropriate power supply 174. A printer 175 is also connected to computer 170 through an RS-232-C-type device or other device known to the art. The printer serves to print out the lead integrity data gathered by computer 170 or distance determinations also made by computer 170.

A plurality of sensors, in addition to the infrared detectors, are connected to computer 170 by various conductive leads. For example, conductive lead 176 connects the rail-closed sensor to the computer for an indication that guide rail 18 is in place over trackway 14. Conductive leads 178 and 180 connect the sensors associated with the accept cartridges in discharge station $S_D$. Conductive lead 182 connects the sensor associated with the reject cartridge to computer 170.

Several conductive leads are also connected to the computer for providing actuation or deactivation signals to various components in the scanner apparatus. For example, conductive lead 184 provides an actuation and deactivation signal to air operated cylinder 186 shown in FIG. 14. Cylinder 186 serves to lower stop arm 188 down on to trackway 14 stopping the passage of DIP devices in the straightener station $S_{ST}$. Stop arm 188 rotates about pivot point 190 and is biased by spring 192 in a normally upward or open position such that DIP devices are free to travel through the straightening station.

Conductive lead 194 serves to provide the activation and deactivation signal to the former motor, which in turn continues or stops movement of DIP devices through the scanner apparatus. Conductive lead 196 provides the activation signal to the shift track operation device in discharge station $S_D$. Depending upon the signal transmitted on conductive lead 196, the shift track will move transversely relative to trackway 14, aligning one of the accept cartridges or the reject cartridge with the trackway. Conductive lead 198 provides the actuation signal to the straightener mechanism should the computer determine that the DIP devices passing on trackway 14 requires lead straightening.

Switch device 200 is a manual switch which serves to select the first or second function mode of switches on data pad 46. When the second function mode has been selected, computer 170 is in the calibration mode. When the first mode is selected, computer 170 is in the normal mode. As previously indicated, during second function mode the scanning heads are calibrated, i.e. the various distances between sensors are determined. The importance of these intervals between the sensors lies in their inclusion in a formula for determining the angular orientation of particular DIP leads. Referring specifically to FIG. 12, distances AB, AC and BC are indicated. AB represents the distance between orifice 130 and 128; AC represents the distance between orifice 132 and a line passing through the center of orifice 128 which also lies perpendicular to the base of the right triangular pattern; BC represents the distance between orifices 130 and 132 along line 133; and PL represents the length of the DIP leads. It is believed that it is a present industry standard that distance PL be greater than or equal to 150 thousandths of an inch. Consequently, orifices 130, 132 will be within 150 thousandths of an inch away from a plane containing the top surface of trackway 14.

The computer of the preferred embodiment contains at least three counters for each scanner head which are operating at a frequency of approximately 1 MHz. In FIG. 12 two of these counters are started by leads occluding the infrared light beam passing to orifice 128. One of the counters is stopped from counting by a lead occluding the infrared light beam passing through orifice 130, while the other counter is stopped from counting by a DIP lead occluding the infrared light beam passing through orifice 132. The third counter is started by a DIP lead occluding light at orifice 132 and stopped by the next consecutive DIP lead occluding light at orifice 132. If counts are to be made between each lead, a plurality of counters will have to be incorporated as being trigered by light being occluded at orifice 132. The resultant counts from all of the above counters are converted by the computer into corresponding time and distance intervals.

In the preferred embodiment, the formula used to determine angular orientation requires that the orifices 128, 130 and 132 be arranged in the pattern shown in FIGS. 11, 12 and 13, that is, a right triangular pattern wherein the base of the triangle is oriented substantially parallel to trackway 14 and wherein the side of the triangle is oriented substantially perpendicular to trackway 14 and lies downstream in the direction of travel and wherein the sensor positioned at the point of intersection of the side and hypotenuse of the triangle, orifice 132, is located perpendicularly further from trackway 14 than the base of the triangle containing orifices 128 and 130. The formula which is used by the computer to determine the angular deviation of DIP lead tips is as follows:

$$\text{deviation} = \frac{\left|\left[\frac{AC_d}{AB_d} \times AC_{tn}\right] - AB_{tn}\right|}{AB_{tn}} \times \frac{PL}{BC_d} \times AB_d$$

wherein $AB_d$ = the distance between the A and B sensors;

$AC_d$ = the distance along a line parallel to the base, from an axis which passes through the A sensor, which axis is perpendicular to the base, to the C sensor;

$BC_d$ = the distance between the B and C sensors; and

PL = the lead length.

It has been found that the use of the above formula in the instant apparatus provides such precise determination of lead tip deviation that various factors, particularly including tolerances and manufacturing errors of both the scanner head orifices and light reception devices, i.e. CLR-5101-2, must be taken into account. These factors are taken into account and the accuracy of the determination is increased by a principal feature of the present invention which involves the combination of a DIP-like calibration device having known characteristics and computer 170 to calculate the various distances required for the above formula. It has further been found that such calibration procedure must be performed with each scanning head. Consequently, if one scanning head, for example head 80, were replaced, the calibration procedure must be repeated for the substitute head.

Figure 20:
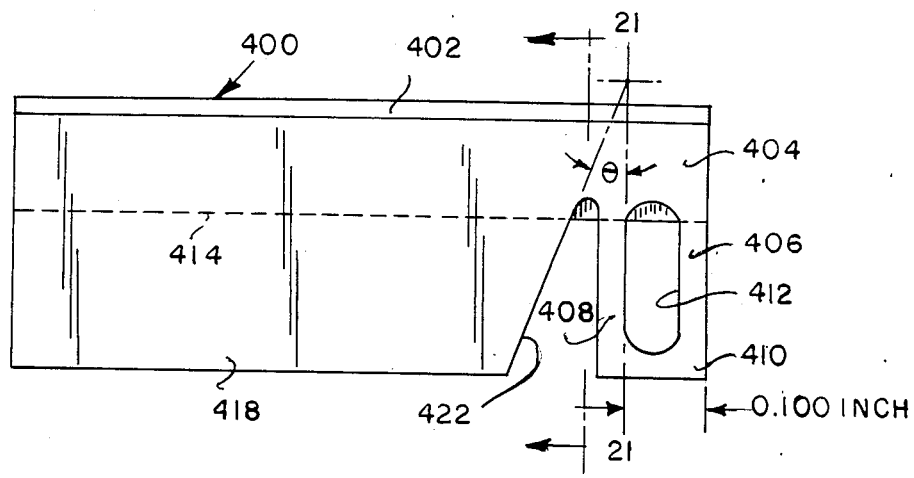
FIG. 20 is a side elevation of a calibration device of a DIP-like configuration.
Figure 21:
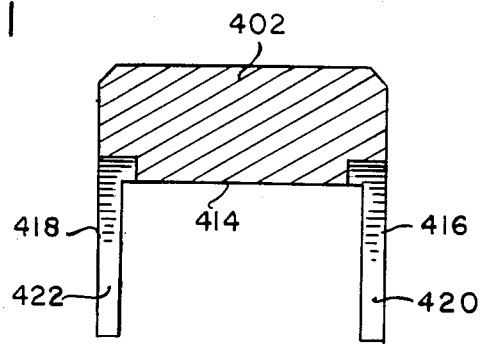
FIG. 21 is a sectional view along line 21—21 of FIG. 20.

The DIP-like device 400 used in the calibration procedure which determines the various required distances, is shown in FIGS. 20 and 21. Calibration device 400 is shown to include a generally rectangular body portion 402 having a forward end 404. Depending from each side of forward end 404, generally perpendicular to body portion 402, are lead-like projections 406 and 408. Each of the projections 406 and 408 have forward edges 410 and 412, respectively. Edges 410 and 412 are substantially mutually parallel. By substantially mutually parallel is meant that these edges are precision formed. Particularly, each edge in the preferred embodiment is within 0.0003 inch perpendicular with a plane formed with the bottom surface 414 of body portion 402.

In the preferred embodiment, edges 410 and 412 are spaced 100 thousands (0.100) of an inch apart within a tolerance of 0.001 inch. Calibration device 400 also includes projections 416 and 418 which depend generally perpendicular from body portion 402. Each projection 416 and 418 have forward edges 420 and 422, respectively, which forward edges are inclined at an angle $\theta$ to forward edges 410 and 412. In the preferred embodiment, the angle of inclination of edges 420 and 422 is 26.56°. This angle having been selected because the tangent of such an angle is approximately 0.5 or one-half.

The various sensor distances required to determine lead deviation are calculated by computer 170 based upon the electrical signals received by computer 170 from the sensors when a calibration device such as that previously described passes the sensors, occluding the infrared light therefrom. Specifically, using calibration device 400, the distance from the A to B sensor is determined from the following formula:

$$AB_d = \frac{AB_{t1}}{CC_{t1}} \times .100 \text{ inch}$$

wherein $AB_d$ = the distance between the A and B sensors;

$AB_{t1}$ = the time it takes projections 406 to pass from the A to B sensors; and $CC_{t1}$ = the time it takes forward edges 410 and 412 to both pass sensor C.

The distance measured from below the A sensor to the C sensor, which distance has already been described in greater detail in connection with FIG. 12, is calculated by computer 170 from the following formula:

$$AC_d = \frac{AC_{t1}}{CC_{t1}} \times .100 \text{ inch}$$

wherein $AC_d$ = the distance from beneath the A sensor to the C sensor; and $AC_{t1}$ = the time it takes projections 406 to pass from the A to C sensors.

The distance from the B to C sensors is determined by computer 170 from the following formula:

$$BC_d = \frac{\frac{AB_d}{AC_d} \times AC_{t3} - AB_{t3}}{AB_{t3}} \times AB_d \times \frac{1}{\text{TAN } \theta}$$

wherein $BC_d$ = the distance between the B and C sensors;

$AC_{t3}$ = the time it takes edges 420 and 422 to pass between the A and C sensors;

$AB_{t3}$ = the time it takes edges 420 and 422 to pass between the A and B sensors; and $\theta$ = the angle by which edges 420 and 422 are inclined.

For reasons previously stated, computer 170 also determines the spacing between DIP leads during operation. The space between DIP leads is determined from the following formula:

$$\text{space} = \frac{CC_{tn}}{AB_{tf}} \times AB_d$$

wherein $CC_{tn}$ = the time it takes any two consecutive leads to pass the C sensor; and $AB_{tf}$ = the time it takes the forward lead of any two consecutive leads to pass between the A and B sensors.

Once the angular orientation and spacing of a DIP lead has been calculated, it is compared to the maximum acceptable deviation and the maximum deviation for straightening all of which will be described in more detail in connection with the programming for computer 170. However briefly if the calculated orientation is less than the maximum acceptable deviation, DIP devices will pass through the straightening station directly to a cartridge designated for acceptable DIP devices. If the calculated DIP lead orientation is above this maximum but below the maximum deviation for straightening, the DIP device will be halted in straightening station $S_T$ by stop arm 188 and a straightening operation will ensue. If the calculated DIP lead orientation is greater than the maximum acceptable deviation and greater than the maximum deviation for straightening, the angular orientation is such that a straightening operation will not assure lead integrity. Therefore, such a DIP device will pass directly to a cartridge designated for rejected DIP devices.

Figure 15:
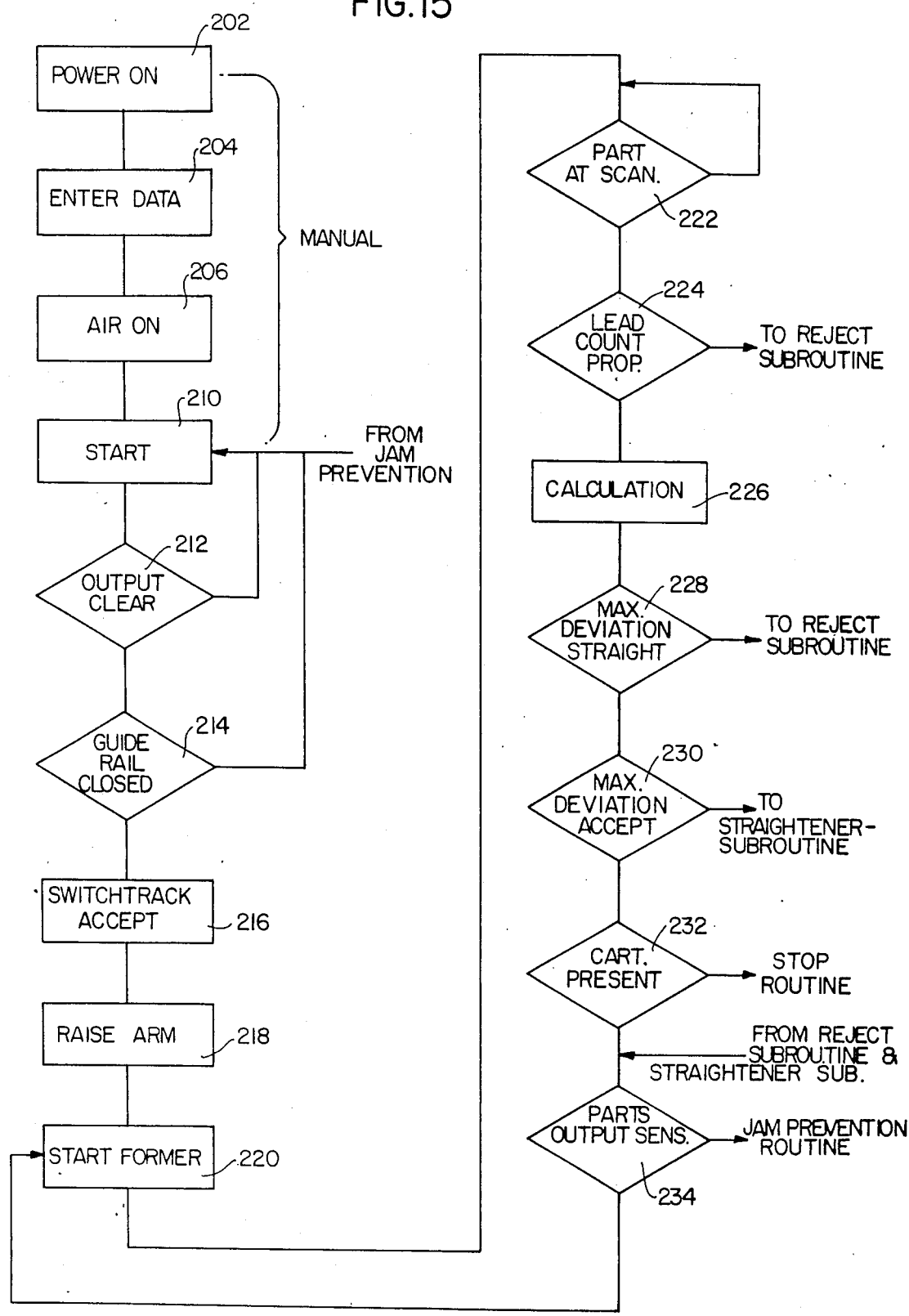
FIG. 15 is a flow chart of the main operating program for the computer shown in FIG. 11.

Considering now the programming provided for computer 170 which is contained in memory 172. A review of this programming will also directly indicate an example of the automatic cycling of the apparatus. FIG. 15 shows the flow chart for the main program used in the computer. The first four steps, 202–210 involve manual operations, wherein step 202 involves turning the power supply on switch activates all of the electronic components in the system including computer 170. Once the computer has been enabled, data is thereafter entered at step 204 for the number of DIPs per lead, deviations, etc. At this space if the data relating to distances between sensors is to be entered manually, the second function switch 200 is activated and such data is entered. At step 206, air is provided to the pneumatic devices in the apparatus. A sensor, preferably a pressure-electric switch known in the art, is used to detect whether air is being supplied to the pneumatic devices in the apparatus and provides input to computer 170 in that regard.

Figure 14:
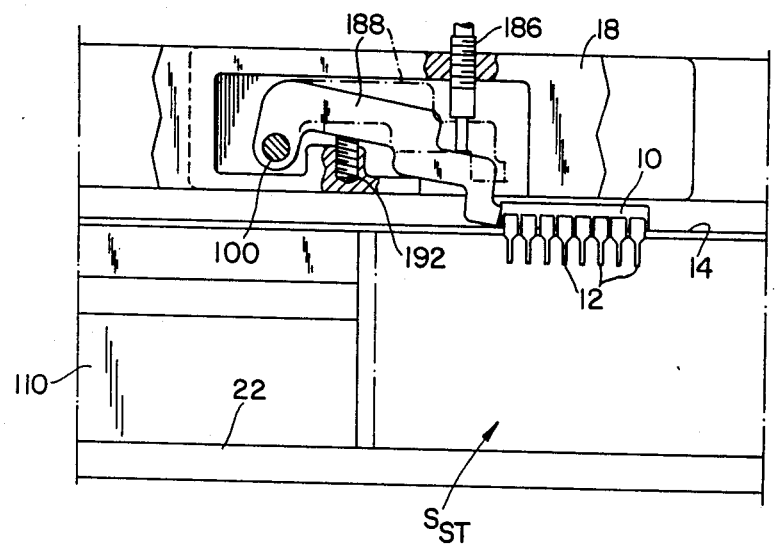
FIG. 14 is a partial sectional view along the line 14—14 of FIG. 2.

The apparatus is now ready to begin determining lead integrity of various DIP devices. The automatic cycling is initiated by depressing the start switch at step 210. Once the start switch has been depressed, computer 170 first determines whether the output of the apparatus is clear. Such status is determined by signals appearing on conductive leads 178, 180 and 182 from sensor 179, 181 and 183, respectively. If the output is not clear the computer goes back to the manual start situation. If the output is in fact clear, the computer next determines at step 214 whether the guide rail 18 is in the closed position. If the guide rail has been closed, the switch track is shifted such that the cartridge designated for rejected DIP devices is aligned by trackway 14. At step 218 stop arm 188, shown down in FIG. 14, is raised away from trackway 14 such that DIP devices can pass freely through the straightening station $S_{ST}$. At step 220 the former motor is started, which in the preferred embodiment comprises a single motor mechanically connected to both former halfs 26 and 28. Starting and stopping the former motor results in the initiation or halting of the movement of elastomeric belts 146 which controls the flow of DIP devices through the former station.

The computer next at step 222 determines whether a part is present at the scanning station. As the DIP device passes through the scanner station, calculations are made at step 224 for each lead in each row of the DIP device. A more detailed explanation of the deviation and calibration process is hereafter provided in connection with FIGS. 22 and 23. However, it will be noted that lead deviations include not only angular deviations but space deviations as well. Once the space between leads has been determined, this value is compared to 0.100 inch. The difference is considered the space deviation. As a DIP device passes through the scanning station, the number of leads are counted to determine whether a proper lead count appears on each DIP device. This DIP lead count is accomplished by counting the number of times leads occlude the infrared light passing through the C sensor. If an improper number of leads is determined, the computer then goes to the reject sub-routine shown in FIG. 17 for rejection of the DIP device.

The deviation calculations, both angular and space deviations, are compared to the maximum deviation for straightening, previously entered. If the calculated value exceeds the maximum deviation for straightening, the computer goes to the reject sub-routine shown in FIG. 17. If the calculated deviation is below the maximum deviation for straightening, the computer determines in step 230 whether the calculated value is above or below the maximum acceptable deviation. If the calculated value is above the maximum acceptable deviation, the computer goes to the straightener sub-routine which is detailed in FIG. 16 herein. If the calculated values fall below the maximum acceptable deviation, the computer continues to step 232 where it is determined whether a cartridge is present at the accept stations. A series of switches $A_S$, $R_S$ and $A_S'$, respectively, are provided in the discharge station to transmit a signal to the computer if a cartridge ($C_A$, $C_R$, $C_A'$) is not present and aligned with the reject and accept parts of the track 14. The connection of these switches to computer 170 is known in the art and therefore, not shown in the drawing. If a switch indicates that a cartridge is not present, the computer goes to a stop routine, not shown in the drawings, whereby the computer stops all operation until cartridges are inserted in cartridge holder. If cartridges are present, the computer next determines whether a DIP device has passed through the output as determined by sensors 179, 181 and 183 providing signals on conductive leads 178, 180 and 182.

Figure 18:
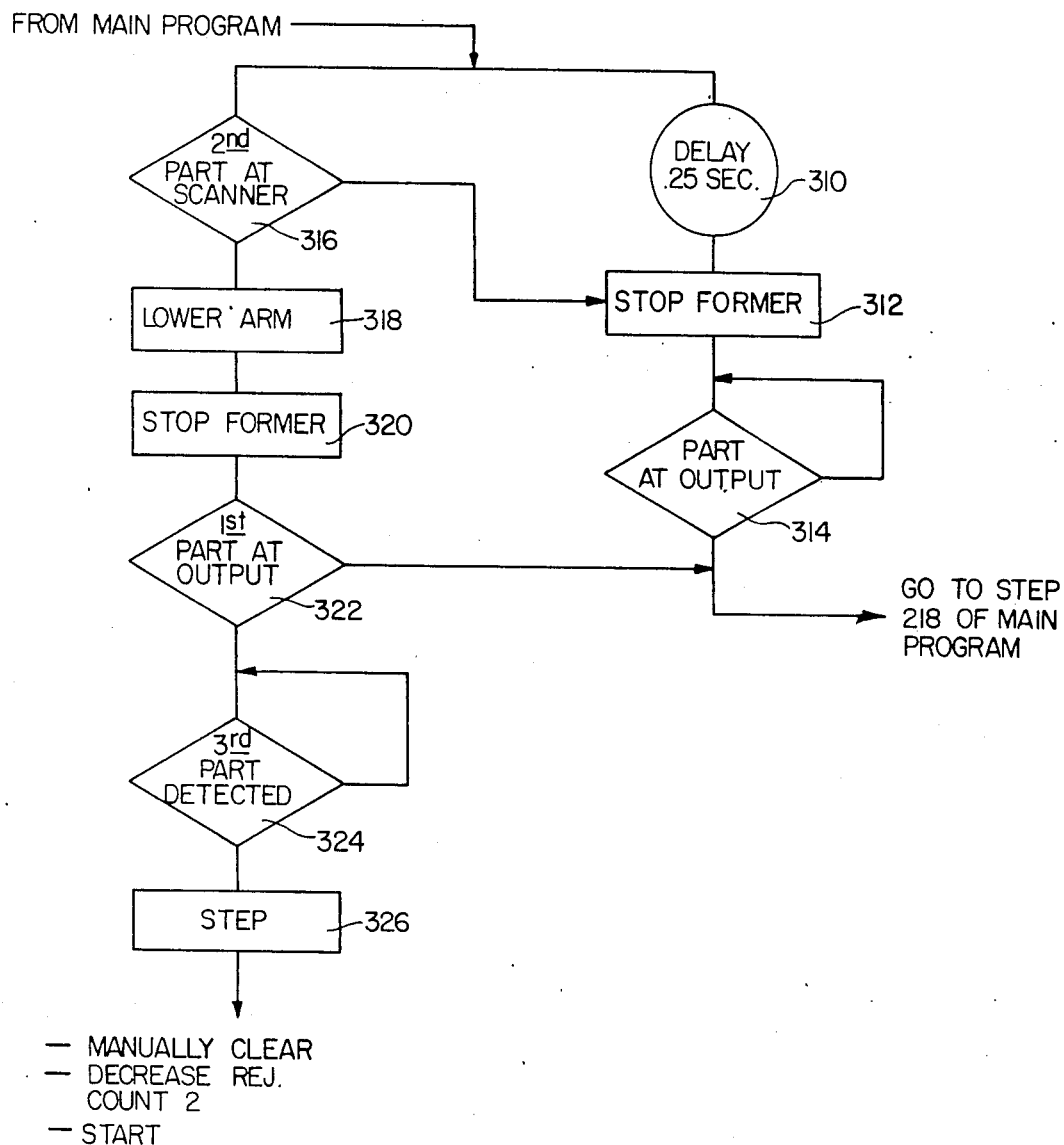
FIG. 18 is a flow chart of a sub-routine of the program shown in FIG. 15.

If the part does not pass this sensor within a prescribed period of time, for example, 250 milliseconds, the computer goes to the jam prevention routine which is shown on FIG. 18. If a passing DIP is sensed at the output, the computer returns to step 220 which provides for the cycling of the next DIP device from the former station $S_F$. The former station allows DIP devices to pass at a rate slow enough to allow the computer to determine the integrity of a DIP device and determine whether a straightening operation or rejection will occur.

Figure 16:
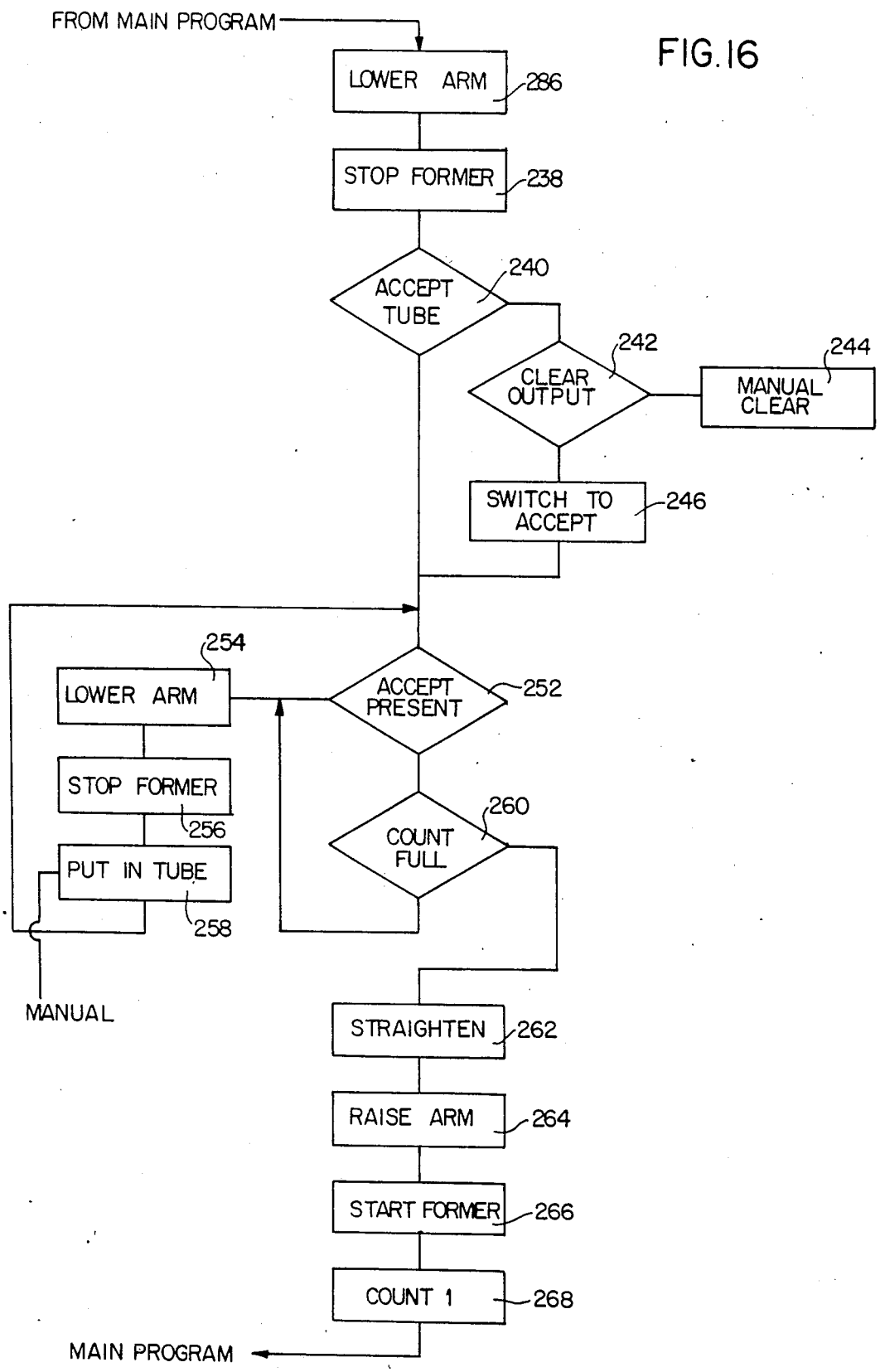
FIG. 16 is a flow chart of a sub-routine of the program shown in FIG. 15.

FIG. 16 discloses the straightener sub-routine program which is used by the computer when a straightening operation is to take place. Once it has been determined a straightening operation is necessary, the computer lowers stop arm 188 at step 236. As the stop arm is lowered, the former motor is also stopped at step 238. Having lowered the stop arm and stopped the former motor, the computer now determines whether the switch track 58 is in an accept alignment. If the switch track is not in an accept alignment, the computer first determines whether the output is clear at step 242. If the output is not clear, the computer waits until the output has been manually cleared at step 244. If the output is clear, the computer switches to one of the accept tracks in switch track 58 at step 246. If it is determined that switch track 58 is in an accept alignment, the computer again determines whether the output sensors are clear in step 248. The computer next determines in step 252 whether an accept tube is present by sensing the output of switches ($C_A$ or $C_A'$). If an accept tube is not present, the computer lowers stop arm 188 in step 254, stops the former motor in 256 and awaits the manual insertion of a cartridge in step 258. If the computer determines in step 252 that an accept tube is present, the computer next determines whether the accept tube is full at step 260. It will be recalled from the discussion of FIG. 3 that the number of DIP devices per tube was entered. As DIP devices pass over the output sensors for the various tubes, which signals are transmitted to the computer on lines 178, 180 and 182, the computer counts the number of DIP devices to determine when the cartridges are full.

If the cartridges are full, the computer returns to step 254 through 258 which allows the manual insertion of a cartridge. If the count is not full, the computer next passes to step 262 wherein the straightening device straightens the DIP leads. The stop arm 188 is raised in step 264 and the former motor is started in step 266. In step 268, the computer counts one more acceptable DIP device.

Figure 17:
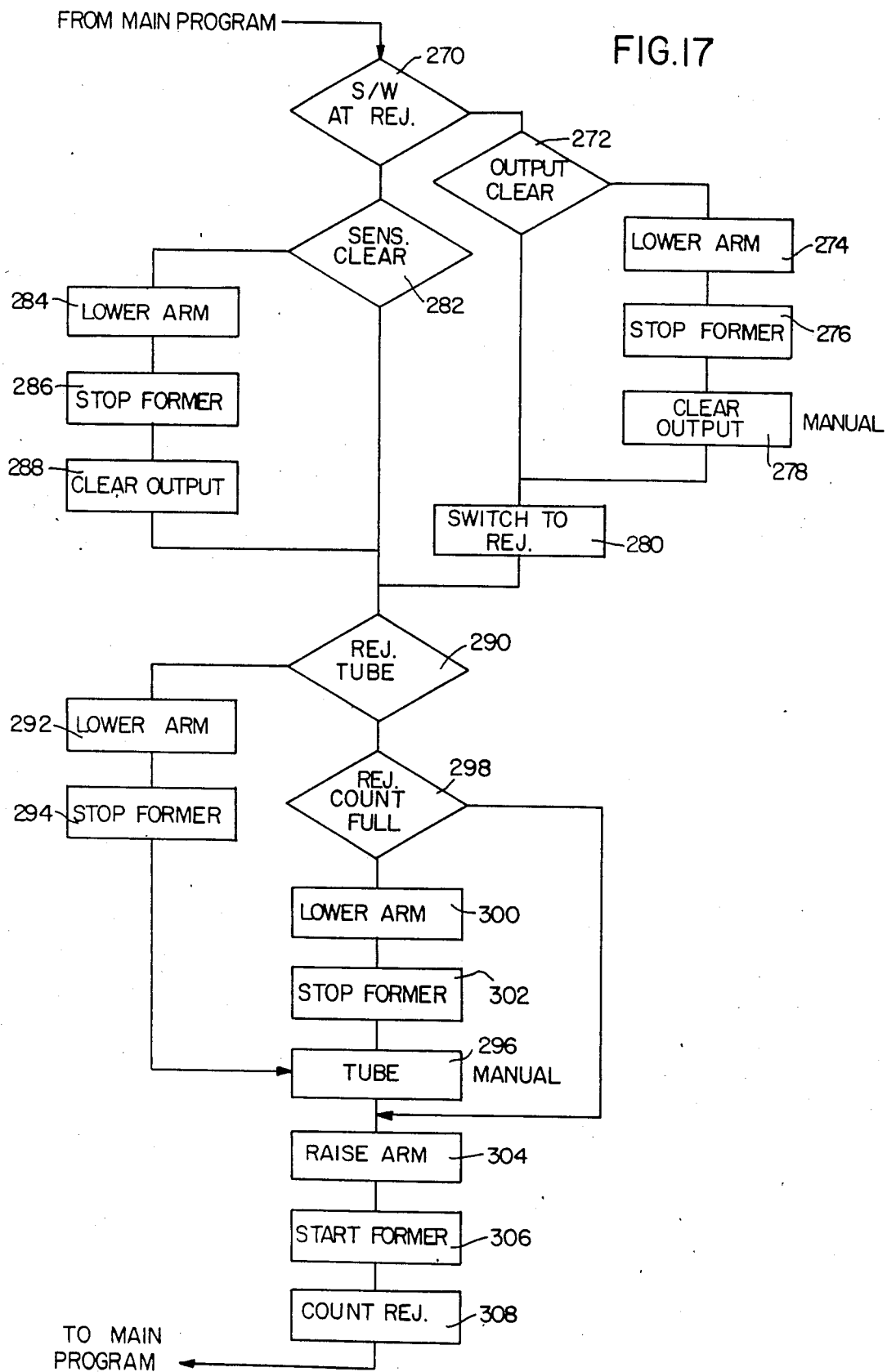
FIG. 17 is a flow chart of a sub-routine of the program shown in FIG. 15.

FIG. 17 discloses the reject sub-routine wherein step 270 the computer first determines whether switch track 58 is in a reject alignment. If switch track 58 is not in such an alignment, the computer at step 272 first determines whether the output of the apparatus is clear. If the output of the apparatus is not clear, the computer lowers the stop arm, stops the former and allows the manual clearing of the output at steps 274 through 278 respectively. If the output of the apparatus is clear, the computer continues to step 280 wherein the switch track 58 is switched to a reject alignment. If it is determined that switch track 58 is already at reject alignment, the computer determines at step 282 whether the output sensor is clear. If the output sensor is not clear, the computer lowers stop arm 188, stops the former motor and allows for the manual clearing of the output at steps 284 through 288, respectively. If the output sensor at step 282 is determined to be clear, or after completion of steps 280 or 288, the computer determines at step 290 whether a reject cartridge is present in switch track 58. If a reject cartridge is not present, the computer lowers stop arm 188 stops the former motor at steps 292 and 294 until a cartridge can be manually inserted in the switch track 58 at step 296. If at step 290 the computer determines that a reject cartridge is present in switch track 58, the computer next determines whether the reject count is full at step 298. If the reject count is full, the computer lowers stop arm 188 and stops the former motor at steps 300 and 302 respectively. Thereafter, the computer waits at step 296 until a reject cartridge can be presented to switch track 58. If at step 298 the reject count is not determined to be full, the computer at step 304 raises stop arm 188, starts the former motor at step 306 and counts one rejected DIP device at step 308. The computer thereafter returns to the main program.

A jam prevention sub-routine is shown on FIG. 18. In the jam prevention routine, the computer is involved in some simultaneous programming. For example, at step 310 the computer pauses for a 0.25 second delay before stopping the former motor at step 312. After passing through step 312 the computer determines whether a part is at the output sensor. Once it has been determined that a part is at the output sensor, the computer goes back to step 218 of the main program. Simultaneously with steps 310, 312 and 314, the computer at step 316 determines whether a second part has reached the scanner. If a second part has not reached the scanner, the computer moves to step 312 and stops the former motor. If a second part has been located at the scanner, the computer lowers stop arm 188 and stops the former motor at 318 and 320, respectively. After stopping the former motor, the computer determines at step 322 whether the first part is at the output. if the first part is not at the output, the computer returns to step 218 of the main program. If the first part has passed the output, the computer determines in step 324 whether a third part has been detected at the scanner heads. Once the third part has been detected at the scanner heads, the computer stops at step 326. A jam is thus prevented from occurring in the apparatus. Consequently, the computer can only be restarted after the trackway has been manually cleared, the rejection count is decreased manually by two and the start switch is depressed.

Figure 22:
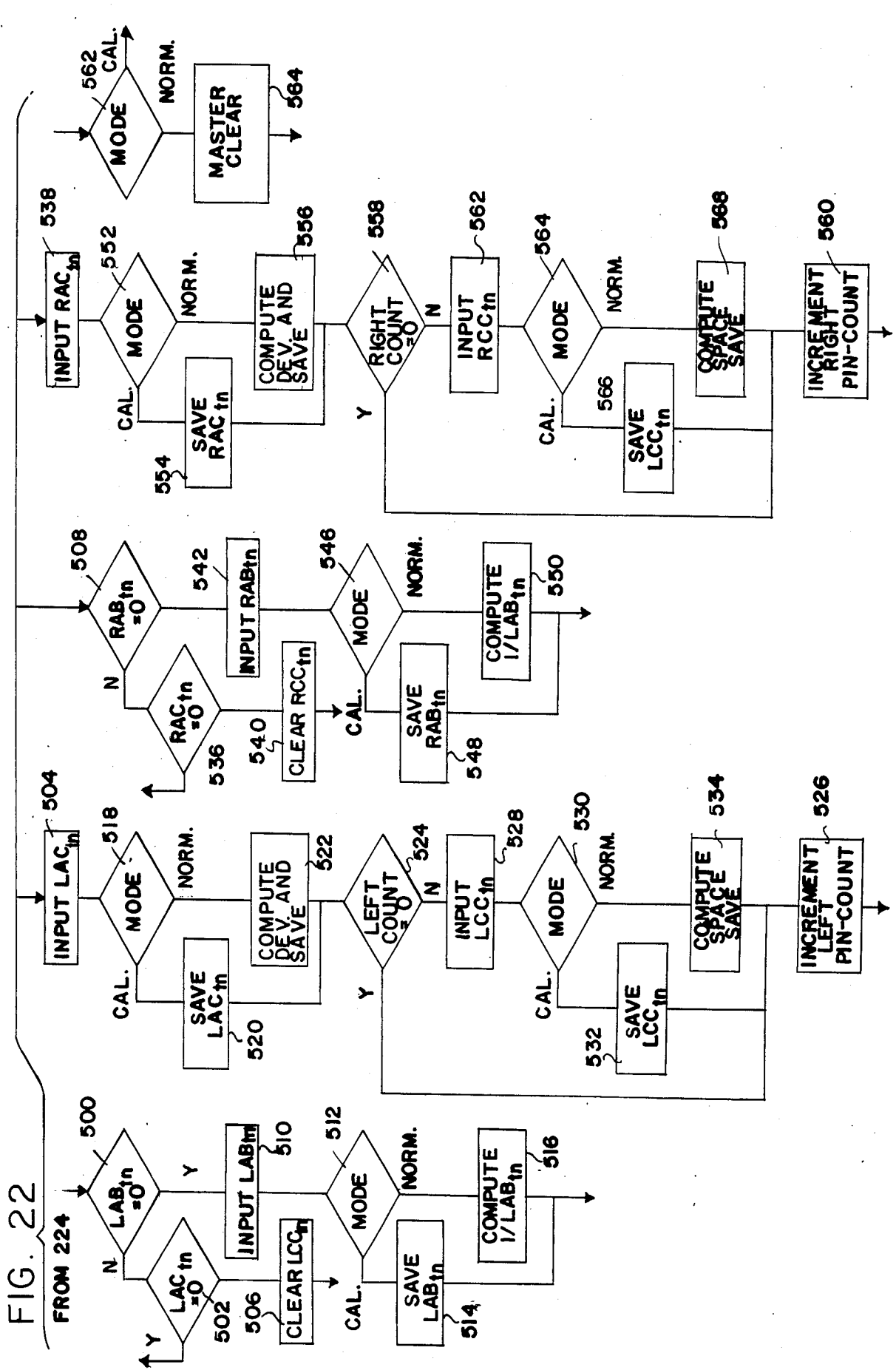
FIG. 22 is a flow chart of the calculation sub-routine of the program shown in FIG. 15.

Having described the operational software of the lead integrity apparatus, consider now that programming contained in computer memory 172 for specifically determining the distances between sensors during calibration and for determining DIP lead deviation. As previously discussed in relation to FIG. 15, after it has been determined at step 222 that a part is at the scanner, the various determinations are made at step 224. Referring now to FIG. 22, the computer first searches its memory to determine whether $LAB_{tn}$ is equal to zero at step 500. If $LAB_{tn}$ is not equal to zero, the computer next determines whether $LAC_{tn}$ is equal to zero at step 502. If $LAC_{tn}$ is equal to zero, the computer inputs this value and proceeds directly to step 504. If $LAC_{tn}$ is determined not to equal zero at step 502, the computer next clears whatever value has been previously stored for $LCC_{tn}$ at step 506 and proceeds to step 504.

Returning to step 500, if it is determined that $LAB_{tn}$ does equal zero, the computer proceeds to step 510 where it inputs $LAB_{tn}$. The computer next determines at step 512 whether the calibration mode switch has been activated or whether the computer is engaged in normal operation. If the computer is in the calibration mode, it will save $LAB_{tn}$ at step 514. If the computer is in the normal mode, it will calculate the fraction $1/LAB_{tn}$ at step 516. After each of steps 514 and 516, the computer proceeds to step 504. At step 518, the computer again determines whether it is in the calibration or normal mode. If the computer is in the calibration mode, it saves $LAC_{tn}$ at step 520. If the computer is in the normal mode, it computes the lead deviation based upon readings from left scanner head 82 at step 522. In other words, the leads on the left side of the DIP device traveling through the left sensor have their deviation determined at step 522.

The computer at step 524 next determines whether the left pin count is equal to zero. If the left pin count is equal to zero, the computer proceeds to increment the left pin count by 1 at step 526 and thereafter proceeds immediately to step 508. If the left pin count is not equal to zero, the computer next inputs $LCC_{tn}$ at step 528. After inputting $LCC_{tn}$ the computer at step 530 again determines whether it is in the calibration or normal modes. In the calibration mode, the computer saves $LCC_{tn}$ at stem 532, while in the normal mode the computer at step 534 computes the space deviation and saves this value. As noted above, the space deviation is determined by comparing the space between two leads to one hundred thousandths (0.100) of an inch. The difference is the space deviation. The left pin count is thereafter incremented at step 526 and the programming proceeds to step 508.

The computer now repeats the pocedure followed for left scanner head 82 for right scanner head 80. For example, if $RAB_{tn}$ does not equal zero, the computer determines at step 536 whether $RAC_{tn}$ equals zero. If $RAC_{tn}$ does equal zero, the computer proceeds to step 538 where it inputs $RAC_{tn}$. If $RAC_{tn}$ does not equal zero, the computer proceeds to step 540 where $RCC_{tn}$ is cleared. Thereafter, the computer proceeds to step 538.

If $RAB_{tn}$ is determined to equal zero, the computer inputs $RAB_{tn}$ at step 542. After next determining whether the computer is in the calibration or normal mode, it will either save $RAB_{tn}$ at step 548 or compute the fraction $1/RAB_{tn}$ at step 550 in the normal mode. After completing either of steps 548 or 550, the computer proceeds to step 538. After determining again whether the computer is in the calibration or normal mode at step 552, the computer next saves $RAC_{tn}$ if in the calibration mode or computes the right lead deviation and saves this value at step 556. After completing either step 554 or 556, the computer next determines at step 558 whether the right lead count equals zero. If the right lead count does equal zero, the computer next immediately proceeds to increment the right pin count at step 560. If the right pin count at step 558 does not equal zero, the computer next proceeds to compute the space between leads by first inputting $RCC_{tn}$ at step 562. After determining whether the computer is in the calibration or normal mode at step 564, the computer either saves $RCC_{tn}$ at step 566 or computes the space deviation between leads at step 568 and saves this value. After completing either of steps 566 or 568, the computer increments the right pin count at step 560. The computer next determines at step 562 whether the calibration or normal mode is in effect. If the normal mode is in effect, the computer runs through a master clearing function wherein all stored times are cleared so that the next left and right leads and their respective deviations can be determined. Accordingly, after completing step 564, the computer will loop back to step 500. This loop will continue until a space of approximately 0.250 inches is determined. Upon making this determination, the computer returns to step 226 of FIG. 15. It will be noted that 0.250 inches is not a critical distance but rather is selected to represent a spacing where it can be reasonably assured that the DIP device has passed out of the scanning station.

Figure 23:
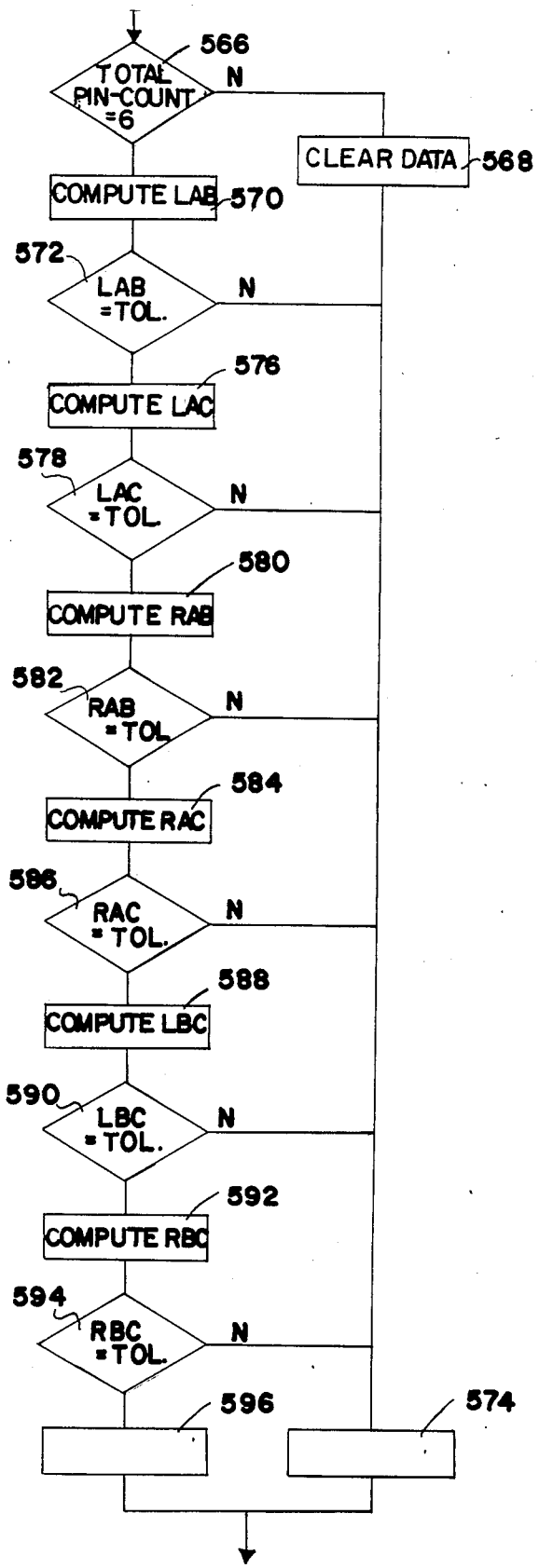
FIG. 23 is a flow chart of the calibration sub-routine of the program shown in FIG. 22.

If it is determined at step 562 that the computer is in the calibration mode, it next proceeds to step 566, shown in FIG. 23 where it is determined whether the total pin count equals 6. It will be recalled that with calibration device 400, each side thereof will generate three pin counts. Accordingly, if the pin count does not equal 6, calibration device 400 has not passed through the scanning station during the calibration mode. The computer will, therefore, clear all data in step 568. If the total pin count is determined at step 566 to equal 6, the computer next computes $LAB_d$. At step 572, the computer determines whether $LAB_d$ is within tolerance. If it is not within tolerance, the computer displays an error at step 574 and thereafter proceeds back to step 210 on FIG. 15. If $LAB_d$ is within tolerance, the computer next determines at step 576 $LAC_d$. If $LAC_d$ is not within tolerance, the computer displays an error at step 574. If $LAC_d$ is within tolerance, the computer next determines $RAB_d$ at step 580. If $RAB_d$ is not in tolerance at step 582, the computer displays an error. If $RAB_d$ is within tolerance, the computer next determines $RAC_d$ at step 584. If $RAC_d$ is not within tolerance, the computer displays an error. If $RAC_d$ is within tolerance at step 586, the computer next determines $LBC_d$ at step 588. If $LBC_d$ is not within tolerance at step 590, the computer displays an error. If $LBC_d$ is within tolerance, the computer next determines $RBC_d$ at step 592. If $RBC_d$ is not within tolerance, the computer displays an error. If $RBC_d$ is within tolerance, the computer displays at step 596 that calibration has completed and thereafter proceeds to step 210 of FIG. 15. All of the formulas necessary and which are operated during the determination of $LAB_d$, $LAC_d$, $RAB_d$, $RAC_d$, $LBC_d$ and $RBC_d$ have all been previously described and identified without preference to left or right scanner heads. Once the calibration routine has been completed, the lead integrity apparatus is now ready to begin determining the lead integrity of DIP devices in the normal mode.

A detailed showing of the shift track structure and operation is presented in FIG. 19. The shift track mechanism comprises a slidable guide mounted carriage member 480. On the upper surface of member 480 there are affixed, in spaced relationship, three separate DIP guide segments, of which 60 is divergent to the left, 62 which runs vertically, or straight, and 64 which is divergent to the right.

The carriage member 480, in a normal home position has centrally mounted track segment 62 axially aligned with the track 14, such that a DIP, which has been rejected, is allowed to run down trackway 14 and into the central collecting empty cartridge $C_R$ that is operatively mounted in cartridge holder 482.

The carriage member 480 is displaceable to the left or right of the trackway 4, thereby aligning the divergent track segments 60 or 64 with trackway 14 by means of two air operated cylinders 484, 486.

If a DIP is to be accepted, as determined by the scanning computer device, cylinder 484 is activated and segmental track 60 is aligned with track 14. The DIP is then diverted to the left, counted and enters into the cartridge $C_A$.

Similarly, if a DIP is to be straightened, as determined by the computer, cylinder 486 is activated and track 64 is aligned with track 14. The cap is then diverted into cartridge container $C_A'$, and counted. It is noted that an alternative and preferred embodiment of the switch track assembly is shown in U.S. application Ser. No. 710,032, now U.S. Pat. No. 4,665,954 identified previously herein.

While specific and particular configurations and constructions are shown in the drawings, minor variations therein will be ovbious to those skilled in the art without departing from the spirit of the invention. Such obvious changes or modifications are considered to be within the scope of the invention concept as expressed herein, and as claimed hereinafter.

We claim:

1. An apparatus for determining lead integrity of DIP devices, comprising:
   a. a trackway for supporting said DIP devices during passage through said apparatus;
   b. light transmitting means for the transmission of light, positioned so that the leads of said DIP devices traveling on said trackway intersect the transmitted light;
   c. light receiving means for receiving and converting transmitted light to an electrical signal, said light receiving means comprising two sets of sensors, three sensors per set, each set of sensors being positioned on either side of said trackway such that the electrical signal produced by each sensor is reflective of light being occluded from said sensor by a DIP lead;
   d. a calibration device having known lead characteristics;
   e. computer means, connected to receive said electrical signals from said sensors, for determining said lead integrity, said determination of lead integrity being based in part upon the distances between said sensors, said distances also being determined by said computer means based on electrical signals produced by said sensors when said calibration device passes said sensors.

2. The apparatus of claim 1, wherein each set of sensors is arranged in a triangular pattern on either side of said trackway.

3. The apparatus of claim 2, wherein said triangular pattern comprises a substantially right triangle arrangement wherein an A sensor is located at the intersection of the base and hypotenuse of said triangular pattern; a B sensor is located at the intersection of the base and side of said triangular pattern downstream in the direction of travel on said trackway, said base being generally parallel to said trackway; and a C sensor located at the intersection of the hypotenuse and side of said triangular pattern, said C sensor being located further from said trackway than the base of said triangular pattern.

4. The apparatus of claim 3, further comprising display means, connected to said computer means, for displaying said distances determined by said computer means.

5. The apparatus of claim 3, wherein said computer determines the distance between said A and B sensors, the distance between said B and C sensors, and the distance between the C sensor and an axis which passes through the A sensor, which axis is also perpendicular to the base of said triangular pattern.

6. The apparatus of claim 5, wherein said calibration device is of a DIP-like configuration comprising a generally rectangular body portion having a forward end, which forward end passes said sensors first as said calibration device travels on said trackway, first and second lead-like projections depending from each side of said body portion at said forward end, each projection having forward edges which are substantially mutually parallel and which are substantially perpendicular to said body portion, and a third projection depending from each side of said body portion behind said forward end each third projection having a forward edge which is inclined relative to the forward edges of said first and second lead-like projections.

7. The apparatus of claim 6, wherein the forward edges of said first and second lead-like projections are spaced one hundred thousandths (0.100) of an inch apart.

8. The apparatus of claim 7, wherein the distance between said A and B sensors is calculated according to the following formula:

$$AB_d = \frac{AB_{t1}}{CC_{t1}} \times .100 \text{ inch}$$

wherein
$AB_d$ = the distance between the A and B sensors;
$AB_{t1}$ = the time for the forward edge of said first projections to pass between the A and B sensors; and
$CC_{t1}$ = the time for each of the forward edges of said first and second lead-like projections to pass the C sensor.

9. The apparatus of claim 8, wherein the distance between the C sensor and an axis which passes through the A sensor, which axis is also perpendicular to the base of said triangular pattern is calculated according to the following formula:

$$AC_d = \frac{AC_{t1}}{CC_{t1}} \times .100 \text{ inch}$$

wherein
$AC_d$ = the distance between the C sensor and an axis which passes through the A sensor, which axis is also perpendicular to the base of said triangular pattern; and
$AC_{t1}$ = the time for the forward edge of said first projections to pass between the A sensor the the C sensor.

10. The apparatus of claim 9, wherein the distance between the B and C sensors is calculated according to the following formula:

$$BC_d = \frac{\frac{AB_d}{AB_d} \times AC_{t3} - AB_{t3}}{AB_{t3}} \times AB_d \times \frac{1}{\text{TAN } \theta}$$

wherein
$BC_d$ = the distance between the B and C sensors;
$AC_{t3}$ = the time for the forward edge of said third projection to pass between said A and C sensors;
$AB_{t3}$ = the time for the forward edge of said third projection to pass between said A and B sensors; and
$\theta$ = the angle by which the forward edge of said third projection is inclined.

11. The apparatus of claim 10, wherein said forward edge of said third projection is inclined at an angle of 26.56° relative to the forward edges of said first and second projections.

12. The apparatus of claim 11, wherein the deviation of DIP leads is determined from the following formula:

$$\text{deviation} = \frac{\left| \left[ \frac{AC_d}{AB_d} \times AC_{tn} \right] - AB_{tn} \right|}{AB_{tn}} \times \frac{PL}{BC_d} \times AB_d$$

wherein
$AC_{tn}$ = the time for any one DIP lead to pass between the A and C sensors;
$AB_{tn}$ = the time for any one DIP lead to pass between the A and B sensors; and
PL = the average length of DIP leads.

13. The apparatus of claim 8, wherein said computer means further determines the spacing between DIP leads according to the following formula:

$$\text{space} = \frac{CC_{tn}}{AB_{tn}} \times AB_d$$

wherein
$CC_{tn}$ = the time for any two consecutive DIP leads to pass said C sensor; and
$AB_{tn}$ = the time for one of said two consecutive leads to pass between the A and B sensors.

14. The apparatus of claim 13, further comprising display means, connected to said computer means, for displaying said spacing between DIP leads determined by said computer means.

15. The apparatus of claim 1, wherein said light transmitting means comprises a trapezoidal-shaped, light-conductive member having inwardly facing light reflective surfaces formed on the inclined sides thereof and a light source, said trapezoidal member being positioned such that light from said source is reflected by one of said reflective surfaces along the length of said trapezoidal member to the other of said reflective surfaces, whereupon said light is reflected so that leads of DIP devices traveling on said trackway intersect said light.

16. The apparatus of claim 15, wherein said inclined sides are each inclined at a 26.56° angle relative to the base of said trapezoidal member.

17. An apparatus for determining lead integrity of DIP devices, comprising:
   a. a trackway for supporting said DIP devices during passage through said apparatus;
   b. transmitting means for the transmission of a signal, positioned so that the leads of said DIP devices traveling on said trackway intersect said signal;
   c. a plurality of receiving means each for receiving and converting said transmitted signal to an electrical signal, said receiving means positioned on either side of said trackway such that said electrical signals are reflective of said transmitted signal being occluded from said receiving means by said DIP leads;
   d. computer means, connected to receive said electrical signals from said plurality of receiving means, for determining said lead integrity, said determination of lead integrity being based in part upon the distances between said receiving means, said distances being determined by said computer means based upon the electrical signals produced when a calibration device having known lead characteristics passes said plurality of receiving means; and
   e. a calibration device, having a generally DIP-like form and having known lead characteristics.

18. A method for determining lead integrity of DIP devices, comprising the steps of:
   a. providing a trackway for supporting said DIP devices during passage thereon;
   b. transmitting light at a position relative to said trackway so that the leads of said DIP devices traveling on said trackway intersect the transmitted light;
   c. receiving and converting said transmitted light to an electrical signal by light receiving means comprising two sets of sensors, three sensors per set, each set of sensors being positioned on either side of said trackway such that the electrical signal produced by each sensor is reflective of light being occluded from said sensor by a DIP lead;
   d. passing a calibration device, being generally DIP-like in form and having known lead characteristics on said trackway;
   e. computing the distances between said sensors based on the electrical signals produced by said sensors when said calibration device passes said sensors; and
   f. computing lead integrity through a computer means connected to receive said electrical signals from said sensors, said computation of lead integrity being based in part upon the distances between said sensors.

19. A method for determining lead integrity of DIP devices, comprising the steps of:
   a. providing a trackway for supporting said DIP devices during passage thereon;
   b. transmitting a signal from a position so that the leads of said DIP devices traveling on said trackway intersect said signal;
   c. receiving and converting said transmitted signal to an electrical signal by a plurality of receiving means positioned on either side of said trackway such that said electrical signals are reflective of said transmitted signal being occluded from said receiving means by said DIP leads;
   d. passing a calibration device, having a generally DIP-like form and having known lead characteristics on said trackway;
   e. determining the distances between said receiving means based upon the electrical signals produced when said calibration device passes said plurality of receiving means; and
   f. computing lead integrity through a computer means, connected to receive said electrical signals from said plurality of receiving means, said computation of lead integrity being based in part upon the distances between said receiving means.

* * * * *